US011189703B2

(12) United States Patent
Nagata

(10) Patent No.: US 11,189,703 B2
(45) Date of Patent: Nov. 30, 2021

(54) SEMICONDUCTOR DEVICE WITH TRENCH STRUCTURE HAVING DIFFERING WIDTHS

(71) Applicant: ROHM CO., LTD., Kyoto (JP)

(72) Inventor: Masaki Nagata, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 16/823,970

(22) Filed: Mar. 19, 2020

(65) Prior Publication Data

US 2020/0312969 A1  Oct. 1, 2020

(30) Foreign Application Priority Data

Mar. 28, 2019  (JP) .............................. JP2019-064952

(51) Int. Cl.
  *H01L 29/423* (2006.01)
  *H01L 29/10* (2006.01)
  *H01L 29/78* (2006.01)

(52) U.S. Cl.
  CPC ...... *H01L 29/4236* (2013.01); *H01L 29/1033* (2013.01); *H01L 29/1095* (2013.01); *H01L 29/7813* (2013.01)

(58) Field of Classification Search
  CPC ............. H01L 29/4236; H01L 29/1033; H01L 29/1095; H01L 29/7813
  See application file for complete search history.

(56) References Cited

U.S. PATENT DOCUMENTS

| | | | |
|---|---|---|---|
| 2006/0027861 A1* | 2/2006 | Takaishi | H01L 29/0634 257/330 |
| 2006/0157779 A1 | 7/2006 | Kachi et al. | |
| 2012/0161154 A1* | 6/2012 | Mimura | H01L 29/7813 257/77 |
| 2012/0319199 A1* | 12/2012 | Zeng | H01L 29/66727 257/334 |
| 2019/0006479 A1* | 1/2019 | Hsu | H01L 29/42376 |
| 2019/0067420 A1* | 2/2019 | Takaya | H01L 29/7813 |
| 2019/0081147 A1* | 3/2019 | West | H01L 29/42368 |
| 2019/0140092 A1* | 5/2019 | Utsumi | H01L 21/0475 |
| 2019/0140094 A1* | 5/2019 | Kurokawa | H01L 29/4236 |
| 2020/0312997 A1* | 10/2020 | Nagata | H01L 29/66727 |
| 2020/0403069 A1* | 12/2020 | Kimoto | H01L 29/42368 |

FOREIGN PATENT DOCUMENTS

| | | |
|---|---|---|
| JP | 2006202931 | 8/2006 |
| WO | 2012165319 | 12/2012 |

* cited by examiner

*Primary Examiner* — Douglas W Owens
(74) *Attorney, Agent, or Firm* — Hamre, Schumann, Mueller & Larson, P.C.

(57) ABSTRACT

A semiconductor device includes a semiconductor layer that has a first surface and a second surface, a trench that is formed at the first surface of the semiconductor layer and that extends in a first direction, an element portion that has a first-conductivity-type first region, a second-conductivity-type second region, and a third-conductivity-type third region that are formed in order along a depth direction of the trench from the first surface of the semiconductor layer, a gate insulating film formed at an inner surface of the trench, and a gate electrode that is embedded in the trench and that faces the first region, the second region, and the third region through the gate insulating film.

15 Claims, 39 Drawing Sheets

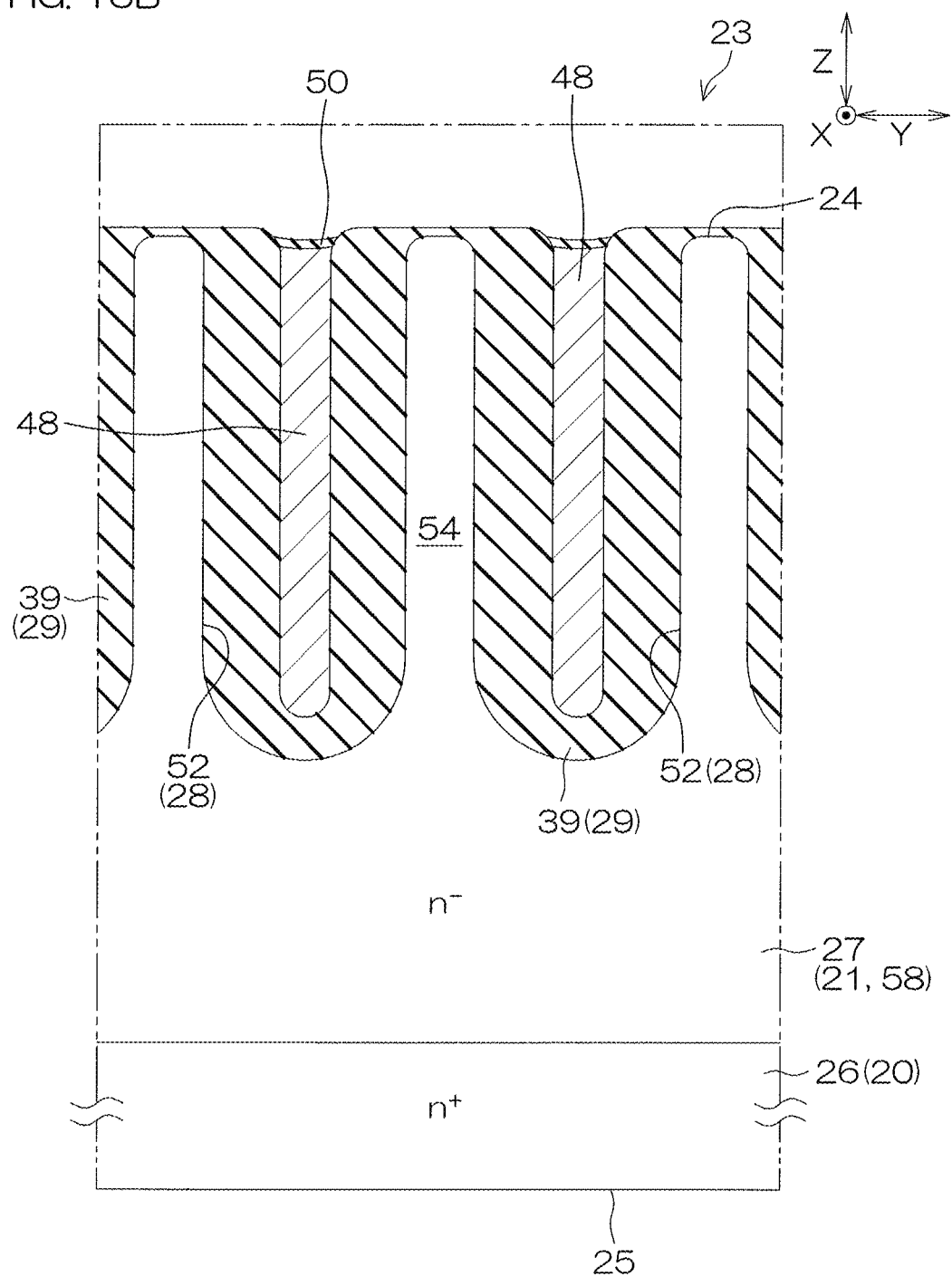

SEMICONDUCTOR DEVICE WITH TRENCH STRUCTURE HAVING DIFFERING WIDTHS

CROSS-REFERENCE TO RELATED APPLICATIONS

The application corresponds to Japanese Patent Application No. 2019-064952 filed in the Japan Patent Office on Mar. 28, 2019, and the entire disclosure of the application is incorporated herein by reference.

TECHNICAL FIELD

The present invention relates to a semiconductor device.

BACKGROUND ART

Patent Literature 1 (International Publication. No. WO 2012/165319 A1) discloses a trench gate power semiconductor device. The semiconductor device includes a drift layer in which a groove is formed, a gate insulating film formed at an inner surface of the groove, and a gate electrode film embedded in the groove across the gate insulating film.

Patent Literature 2 (Japanese Patent. Application Publication No. 2006-202931) discloses a semiconductor device that has a power transistor having trench gate structure. The semiconductor device includes an epitaxial layer (drift layer) that has a principal surface in which a groove is formed, a gate insulating layer formed at an inner surface of the groove, a dummy gate electrode and a gate electrode both of which are embedded in a groove across the gate insulating layer, and an insulating layer interposed between the dummy gate electrode and the gate electrode.

SUMMARY OF INVENTION

In order to suppress a decrease in withstand voltage in an outer peripheral portion of an element portion (cell) of a semiconductor device, it is possible to consider that a channel region is formed widely to the outer peripheral portion positioned on a more outward side than a termination of a gate trench. However, this way is liable to cause a walk-out phenomenon and a walk-in phenomenon. Herein, the term "walk-out phenomenon" denotes a phenomenon in which, for example, a normal drain-to-source breakdown voltage ($BV_{DSS}$) characteristic is shown at second and subsequent measurements (repeated remeasurements) although the drain-to-source breakdown voltage characteristic is unstable at a first measurement. The term "walk-in phenomenon" denotes phenomenon in which, for example, a deterioration in the drain-to-source breakdown voltage ($BV_{DSS}$) characteristic is shown at second and subsequent measurements (repeated remeasurements) although the drain-to-source breakdown voltage ($BV_{DSS}$) characteristic is normal at a first measurement These phenomena can be factors of instability in the device withstand voltage characteristic.

it is possible to consider that an end portion of the channel region is positioned on a more inward side than the termination of the gate trench as a countermeasure against the walk-out and walk-in phenomena, and yet a channel area in the element: portion is liable to be narrowed, and on-resistance is liable to become high.

An object of the present invention is to provide a semiconductor device that is capable of suppressing a decrease in withstand voltage in an outer peripheral portion of the element portion and suppressing a decrease in on-resistance resulting from the decrease in withstand voltage.

A semiconductor device according to an aspect of the present invention includes a semiconductor layer that has a first surface and a second surface, a trench that is formed at the first surface of the semiconductor layer and that extends in a first direction, an element portion that has a first-conductivity-type first region, second-conductivity-type second region, and third-conductivity-type third region that are formed in order along a depth direction of the trench from the first surface of the semiconductor layer, a gate insulating film formed at an inner surface of the trench, and a gate electrode that is embedded in the trench and that faces the first region, the second region, and the third region through the gate insulating film, and the trench includes a first portion in which the gate electrode is embedded and that has a first width and a second portion that is formed at an outer peripheral portion positioned on a more outward side than a termination of the gate electrode in the first direction and that has a second width larger than the first width.

Effects of Invention

According to the semiconductor device according to an aspect, of the present invention, the width (second width) of the trench of the outer peripheral portion is made larger than the width (first width) of the trench of the element portion, and, as a result, it is possible to reduce the width of a part (for example, a mesa portion in a cross-sectional view) of the semiconductor layer positioned between the trenches of the outer peripheral portion. This makes it possible to easily extend a depletion layer toward the end of the outer peripheral portion. In other words, it is possible to suppress a decrease in withstand voltage in the outer peripheral portion regardless of the position of the end of the second region used as, for example, a channel region. As a result, the degree of freedom with respect to the position of the end of the second region becomes higher, and therefore it is possible to suppress a reduction in channel area in the element portion and suppress a decrease in on-resistance by forming the second region within an appropriate range.

BRIEF DESCRIPTION OF DRAWINGS

FIG. 6 is cross-sectional view taken along line VI-VI in. FIG. 4.

FIGS. 8A and 8B to FIGS. 19A and 19B are views showing a part of a process of manufacturing the semiconductor device.

DESCRIPTION OF EMBODIMENTS

Preferred Embodiments of the Present Invention

Figure 1:
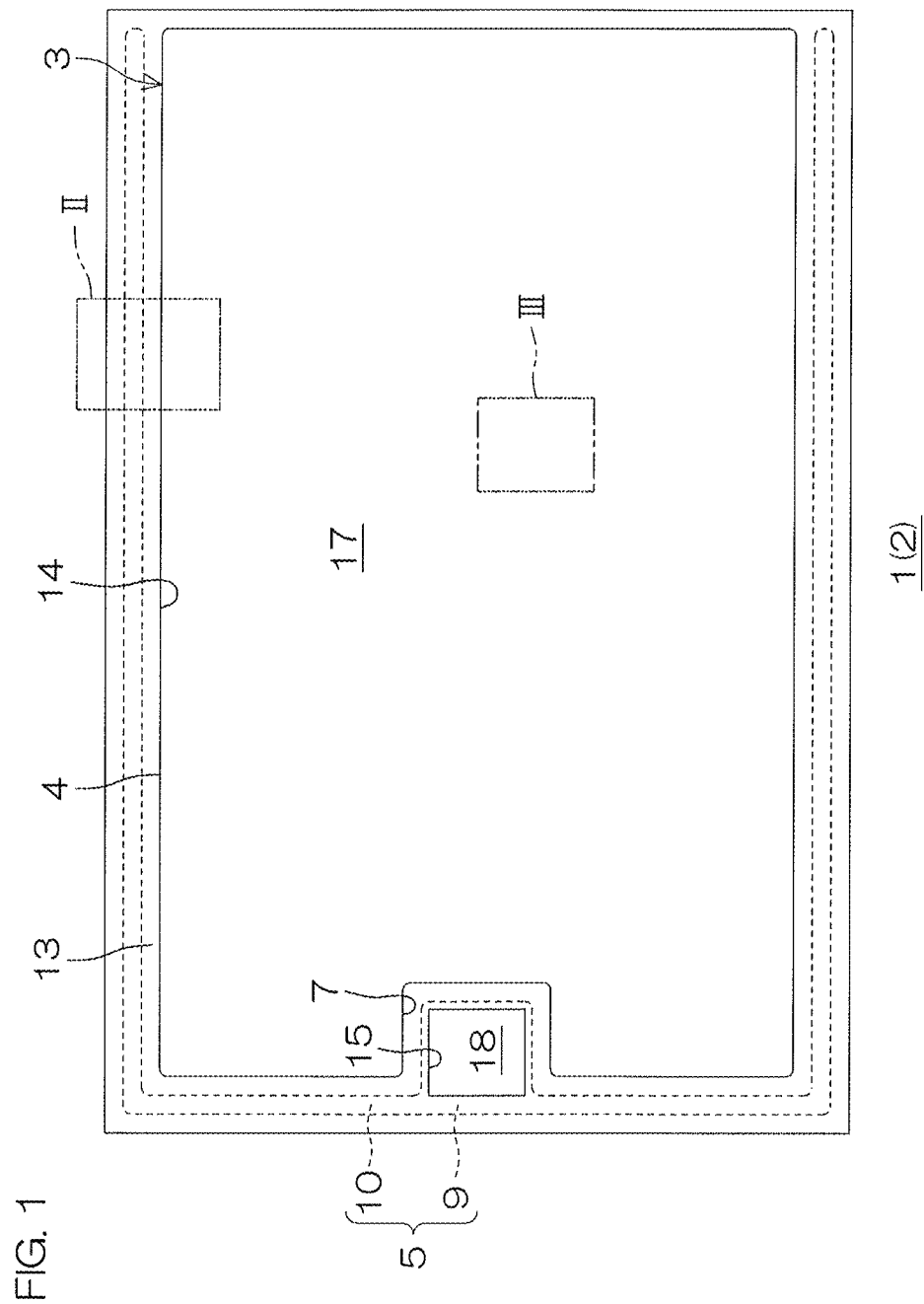
FIG. 1 is a schematic plan view of a semiconductor device according to a preferred embodiment of the present invention.

First, preferred embodiments of the present invention will be described in itemized form.

A semiconductor device according to a preferred embodiment of the present invention includes a semiconductor layer that has a first surface and a second surface, a trench that is formed at the first surface of the semiconductor layer and that extends in a first direction, an element portion that has a first-conductivity-type first region, a second-conductivity-type second region, and third-conductivity-type third region that are formed in order along a depth direction of the trench from the first surface of the semiconductor layer, a gate insulating film formed at an inner surface of the trench, and a gate electrode that is embedded in the trench and that faces the first region, the second region, and the third region through the gate insulating film, and the trench includes a first portion in which the gate electrode is embedded and that has a first width and a second portion that is formed at an outer peripheral portion positioned on a more outward side than a termination of the gate electrode in the first direction and that has a second width larger than the first width.

According to this arrangement, the width (second width) of the trench of the outer peripheral portion is made larger than the width (first width) of the trench of the element portion, and, as a result, it is possible to reduce the width of a part (for example, a mesa portion in a cross-sectional view) of the semiconductor layer positioned between the trenches of the outer peripheral portion. This makes it possible to easily extend a depletion layer toward the end of the outer peripheral portion. In other words, it is possible to suppress a decrease in withstand voltage in the outer peripheral portion regardless of the position of the end of the second region used as, for example, a channel region. As a result, the degree of freedom with respect to the position of the end of the second region becomes higher, and therefore it is possible to suppress a reduction in channel area in the element portion and suppress a decrease in on-resistance by forming the second region within an appropriate range.

In the semiconductor device according to a preferred embodiment of the present invention, the second region may have a termination that coincides with the termination of the gate electrode in the first direction.

In the semiconductor device according to a preferred embodiment of the present invention, the second region may have an extending portion that extends further to a region adjacent to the second portion of the trench than to the termination of the gate electrode in the first direction.

According to this arrangement, the extending portion of the second region is set to be positioned on a more outward side than the termination of the gate electrode. This makes it possible to prevent the termination of the second region from being positioned on a more inward side than the termination of the gate electrode even if a positional deviation from a design range somewhat occurs when the second region is formed (for example, when ion implantation is performed). As a result, it is possible to prevent the channel area from being reduced in the element portion.

In the semiconductor device according to a preferred embodiment of the present invention, an extending portion of the third region may be formed between the termination of the second region in the first direction and the termination of the trench.

In the semiconductor device according to preferred embodiment of the present invention, a distance from the termination of the trench in the first direction to the termination of the second region in the first direction may be 3 μm to 15 μm.

In the semiconductor device according to a preferred embodiment of the present invention, a width of a part of the semiconductor layer between the second portions of the trenches may be 0.2 μm to 1.0 μm.

In the semiconductor device according to a preferred embodiment of the present invention, the trench may be arranged in a plurality of stripes, and the trenches may be independent of each other.

In the semiconductor device according to a preferred embodiment of the present invention, the trench may be arranged in a plurality of stripes, and the semiconductor device may further include a second trench by which the terminations in the first direction of the adjoining trenches are connected together and that extends in a second direction intersecting the first direction.

The semiconductor device according to a preferred embodiment of the present invention may further include a second gate electrode embedded in a bottom-surface side of the trench with respect to the gate electrode, and an intermediate insulating film may be formed between the gate electrode and the second gate electrode.

In the semiconductor device according to a preferred embodiment of the present invention, the gate insulating film may include a first portion formed on the bottom-surface side of the trench and a second portion that is formed on an opening side of the trench and that is thinner than the first portion, and the gate electrode may be embedded in the trench across the first portion of the gate insulating film, and the second gate electrode may be embedded in the trench across the second portion of the gate insulating film.

In the semiconductor device according to a preferred embodiment of the present invention, the element portion may include a MISFET that has the first region serving as a source region and the second region serving as a channel region.

In the semiconductor device according to a preferred embodiment of the present invention, the element portion may include an IGBT that has the first region serving as an emitter region, the second region serving as a base region, and a second-conductivity-type collector region contiguous to the third region.

Detailed Description of Preferred Embodiments of the Present Invention

Next, preferred embodiments of the present invention will be described in detail with reference to the accompanying drawings.

FIG. is a schematic plan view of a semiconductor device 1 according to a preferred embodiment of the present invention.

The semiconductor device I has a quadrilateral shape (in FIG. 1, a rectangular shape) in a plan view. For example, a MISFET (Metal Insulator Semiconductor Field Effect Transistor) 2 is formed in the semiconductor device 1. An electrode film 3 is formed at a surface of the semiconductor device 1. Substantially the entirety of the surface of the semiconductor device 1 is covered with the electrode film 3. In the present preferred embodiment, the electrode film 3 includes a source electrode film 4 and a first gate electrode film 5.

The source electrode film 4 is formed at substantially the entirety of the surface of the semiconductor device 1. A first concave portion 7 is selectively formed at the source electrode film 4 in a plan view.

The first gate electrode film 5 integrally includes a first pad portion 9 formed in the first concave portion 7 of the source electrode film 4 in a plan view and a first finger portion 10 that extends from the first pad portion 9 along a side (circumferential edge) of the semiconductor device 1. In the present preferred embodiment, the first finger portion 10 is formed at both sides of the source electrode film 4. The first finger portion 10 extends in parallel along a pair of mutually facing sides (for example, upper and lower sides in FIG. 1) of the semiconductor device 1, and has a termination in a corner portion of the semiconductor device 1.

A part of the electrode film 3 is covered with a passivation film 13 formed at the surface of the semiconductor device 1. The passivation film 13 collectively covers the source electrode film 4 and the first gate electrode film 5, and has a plurality of openings 14 and 15 by which a part of these electrode films 3 is exposed. In FIG. 1, a part of the first pad portion 9 and the first finger portion 10 of the first gate electrode film 5 are shown by the broken line, and the broken-line portion is a portion covered with the passivation film 13. On the other hand, a part of the source electrode film 4 is likewise covered with the passivation film 13, and yet the covered portion is omitted and is not shown in FIG. 1.

A part of the source electrode film 4 is exposed from the first pad opening 14 so as to serve as a source pad 17, and a part (the first pad portion 9) of the first gate electrode film 5 is exposed from the second pad opening 15 so as to serve as a first gate pad 18. A bonding material, such as a bonding wire, may be bonded to each of the pads 17 and 18 when the semiconductor device 1 is packaged.

Figure 2:
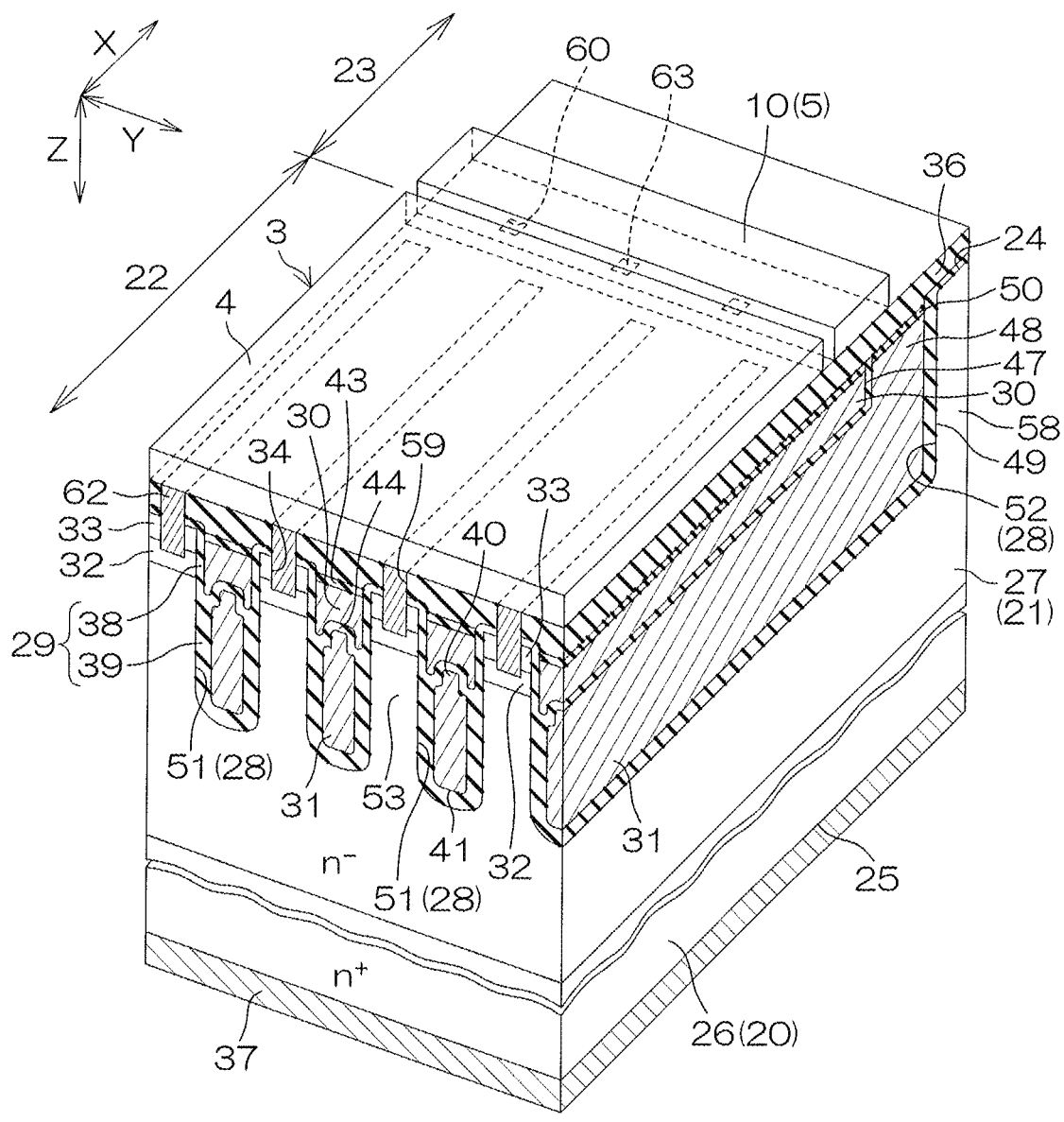
FIG. 2 is a perspective view of a part surrounded by an alternate long and two short dashed line II in FIG. 1.
Figure 3:
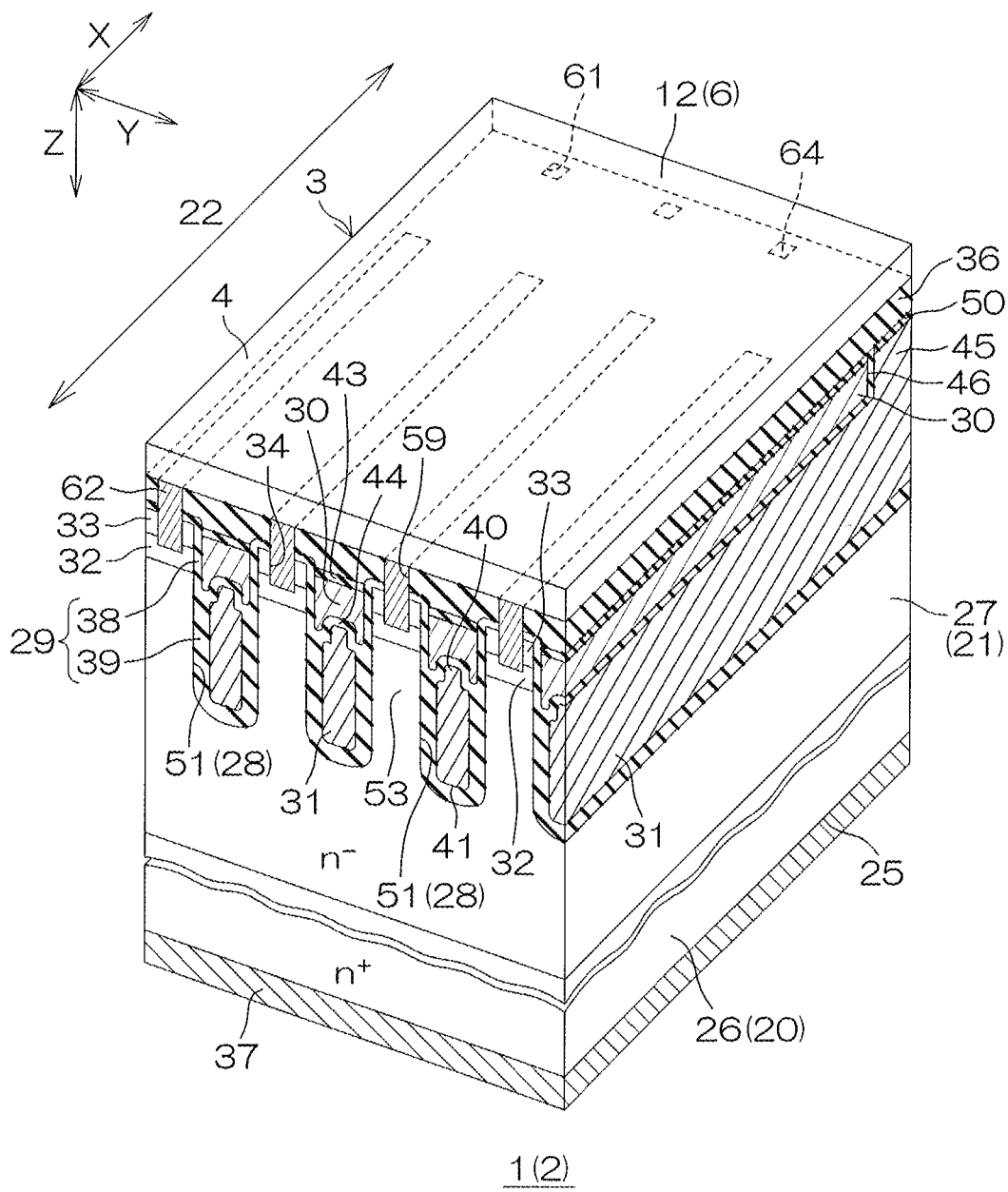
FIG. 3 is a perspective view in the part surrounded with alternate long and two short dashed line III in FIG. 1.
Figure 4:
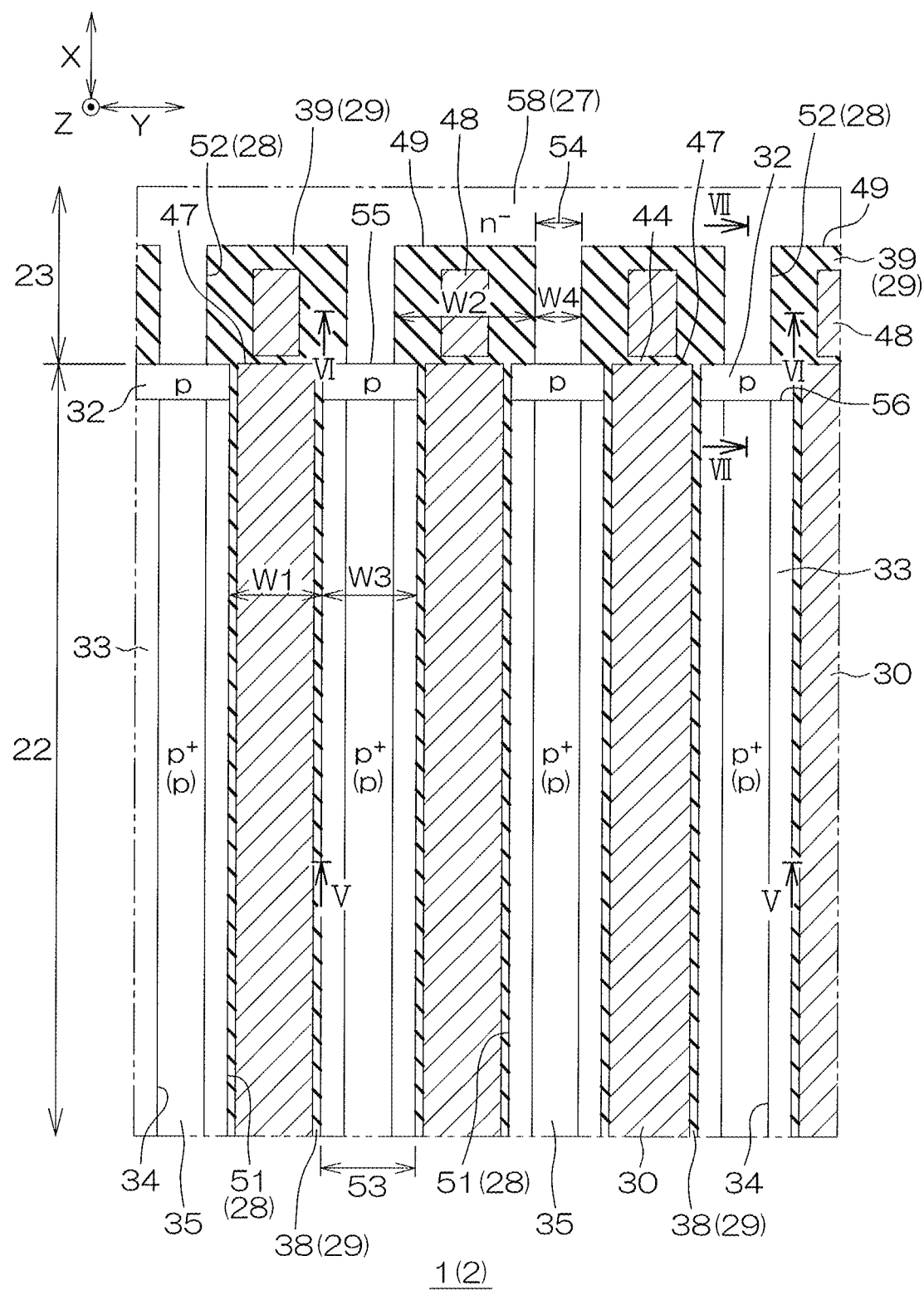
FIG. 4 is a see-through enlarged plan view showing a configuration of a part of the semiconductor device.
Figure 5:
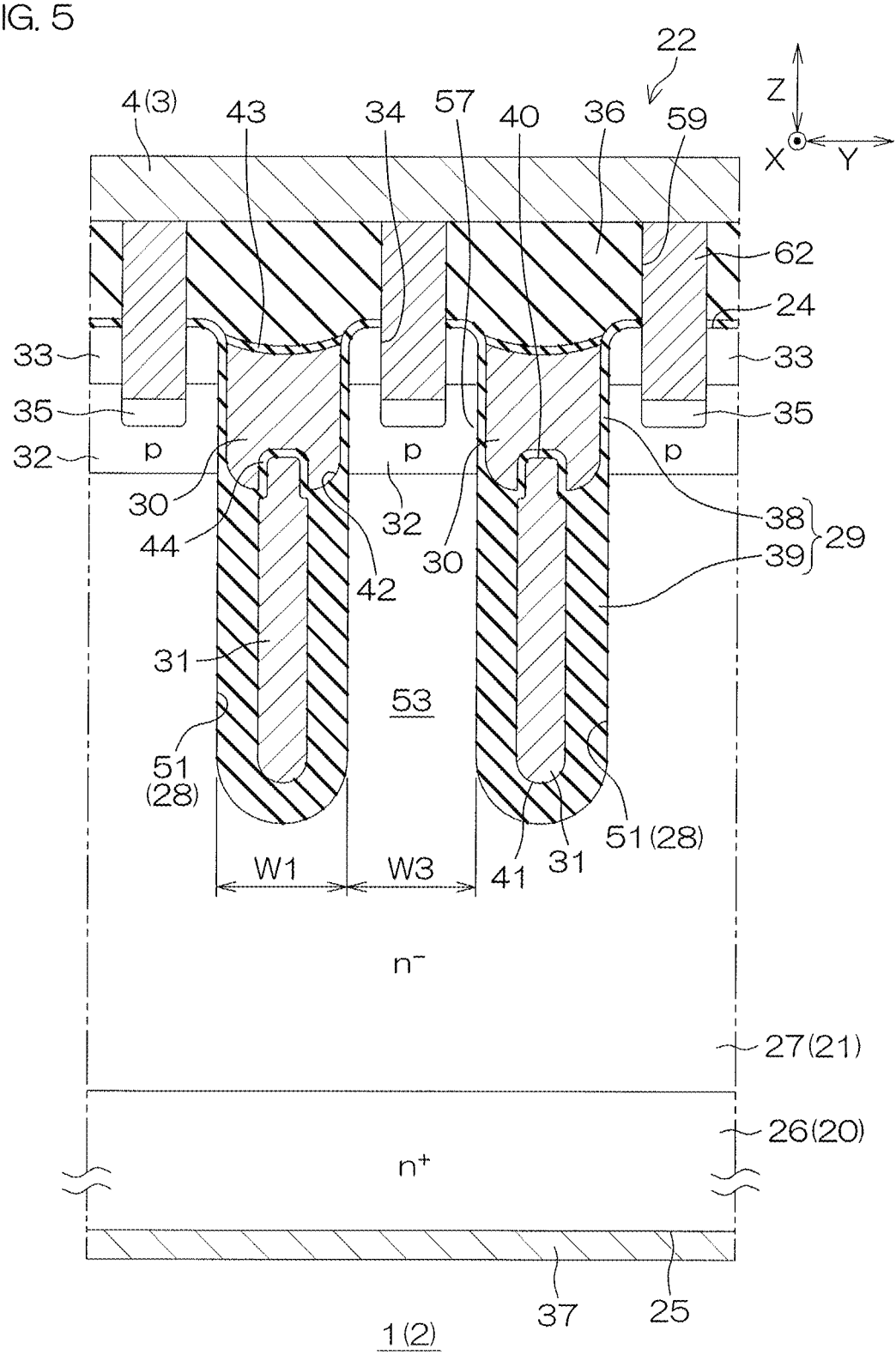
FIG. 5 is a cross-sectional view taken along line V-V in FIG. 4.
Figure 6:
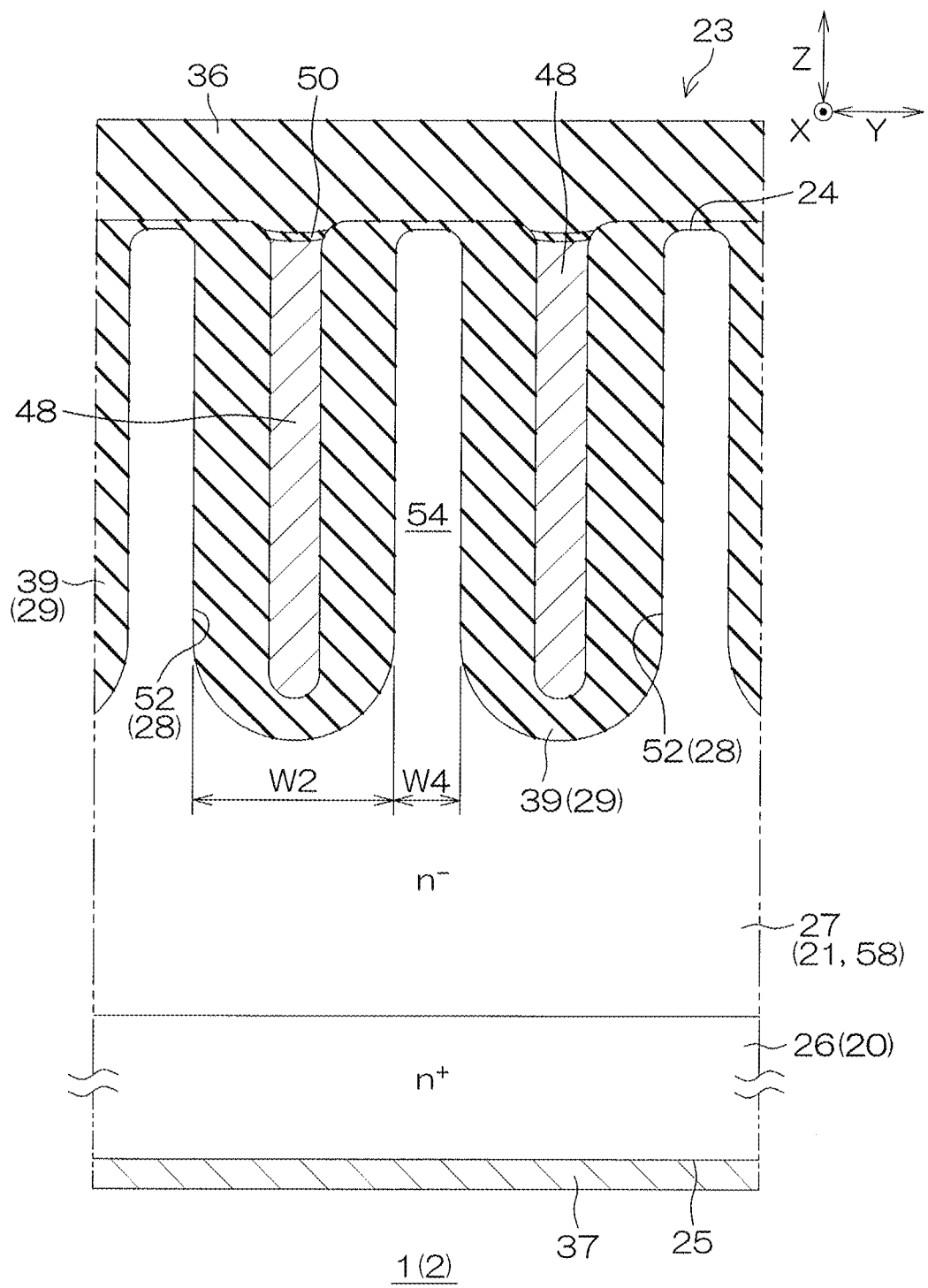
Figure 7:
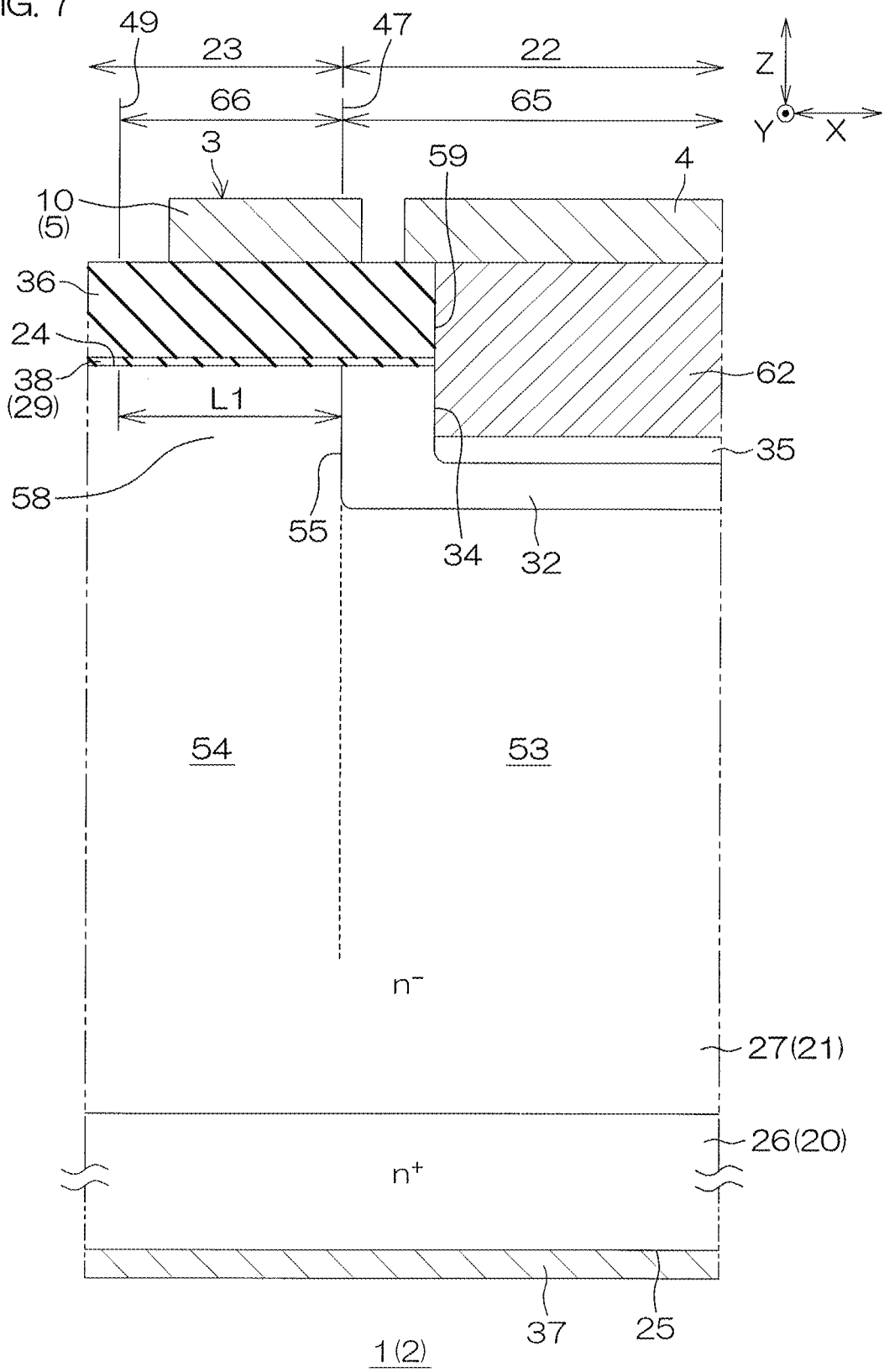
FIG. 7 is a cross-sectional view taken along line VII-VII in FIG. 4.

FIG. 2 is a schematic perspective view of the semiconductor device 1, and shows a part surrounded by an alternate long and two short dashed line II in FIG. 1. FIG. 3 is a schematic perspective view of the semiconductor device 1, and shows a part surrounded by an alternate long and two short dashed line III in FIG. 1. FIG. 4 is a see-through enlarged plan view showing a configuration of a part of the semiconductor device 1, in which the electrode film 3, an interlayer insulating film 36, and plug electrodes 62 to 64 are omitted and are not shown. FIG. 5 is a cross-sectional view taken along line V-V in FIG. 4 FIG. 6 is a cross-sectional view taken along line VI-VI in FIG. 4. FIG. 7 is a cross-sectional view taken along line VII-VII in. FIG. 4.

Constituents, such as the electrode film 3, that are omitted in FIG. 4 are shown in FIG. 5 to FIG. 7. Additionally, an embedded portion 65 of a first gate electrode 30 and an embedded portion 66 of a second gate electrode 31 (Second extension portion 48) are conveniently shown by arrows, respectively, in FIG. 7.

The semiconductor device 1 includes a semiconductor substrate 20, which is an example of a semiconductor layer of the present invention, and an epitaxial layer 21 positioned on the semiconductor substrate 20.

In the present preferred embodiment, the semiconductor substrate 20 may be an $n^+$ type semiconductor substrate (for example, silicon substrate). Besides, the semiconductor substrate 20 may be a substrate that is generally employed in a transistor, such as an SiC substrate, a GaN substrate, etc. The $n^+$ type semiconductor substrate 20 may be a semiconductor substrate that is subjected to crystal growth while being doped with n type impurities. P (phosphorus), As (arsenic), SB (antimony), etc., can be used as the n type impurities. Additionally, the impurity concentration of the $n^+$ type semiconductor substrate 20 may be, for example, approximately $1.0 \times 10^{18}$ cm$^{-3}$ to $5.0 \times 10^{20}$ cm$^{-3}$.

The epitaxial layer 21 may be, for example, an $n^-$ type layer that has been epitaxially grown while implanting n type impurities onto the $n^+$ type semiconductor substrate 20. The aforementioned chemical elements can be used as the n type impurities. Additionally, the impurity concentration of the $n^-$ type epitaxial layer 21 may be lower than the $n^+$ type semiconductor substrate 20, i.e., may be, for example, approximately $1.0 \times 10^{10}$ cm$^{-3}$ to $1.0 \times 10^{18}$ cm$^{-3}$.

The semiconductor device 1 has an element portion 22 and an outer peripheral portion 23 that surrounds the element portion 22, and the element portion 22 is provided with the n-channel type MISFET 2. The MISFET 2 is an element having a vertical structure in which an electric current flows between a surface (first surface 24) of the epitaxial layer 21 and a rear surface (second surface 25) of the semiconductor substrate 20 in the thickness direction of these surfaces.

The MISFET 2 includes an $n^+$ type drain layer 26, an $n^-$ type drift layer 27, which is an example of a third region of the present invention, a gate trench 28, a gate insulating film 29, a first gate electrode 30, a second gate electrode 31, a p type channel region 32, which is an example of a second region of the present invention, an $n^+$ type source region 33, which is an example of a first region of the present invention, a contact trench 34, a $n^+$ type channel contact region 35, the interlayer insulating film 36, and a drain electrode 37.

The $n^+$ type drain layer 26 may be formed of the aforementioned semiconductor substrate 20, and the $n^-$ type drift layer 27 may be formed of the aforementioned epitaxial layer 21.

The gate trench 28 is formed at the first surface 24 of the epitaxial layer 21. Referring to FIG. 2 to FIG. 4, the gate trench 28 extends in an X direction, which is an example of a first direction of the present invention. More specifically, a plurality of gate trenches 28 that are independent of each other are formed. The gate trenches 28 are in parallel with each other.

The gate insulating film 29 is formed at an inner surface of the gate trench 28. The gate insulating film. 29 may be made of, for example, a silicon oxide film, a silicon nitride film, a silicon oxynitride film, a hafnium oxide film, an alumina film, a tantalum oxide film, etc. If the gate insulating film 29 is made of a silicon oxide film, the MISFET 2 may be referred to as MOSFET (Metal Oxide Semiconductor Field Effect Transistor)

The gate insulating film 29 includes a second portion 39 and a first portion 38 that are formed in this order from a bottom-surface side of the gate trench 28 toward the 39 and the first portion 38 of the gate insulating film 29 are continuous with each other. The bottom surface of the gate trench 28 and a part of a side surface extending from the bottom surface are covered with the second portion 39, and the remaining part of the side surface from the second portion 39 to an opening end of the gate trench 28 and the first surface 24 of the epitaxial layer 21 are covered with the first portion 38.

The second portion 39 of the gate insulating film 29 has a thickness larger than that of the first portion 38.

For example, the thickness of the second portion 39 of the gate insulating film 29 may be 1000 Å to 15000 Å, and the thickness of the first portion 38 of the gate insulating film 29 may be 350 Å to 1000 Å.

The first gate electrode 30 and the second gate electrode 31 are embedded in the gate trench 28 across the gate insulating film 29.

More specifically, the second gate electrode 31 is embedded in the bottom-surface side of the gate trench 28 across the second portion 39 of the gate insulating film 29. The second gate electrode 31 may include a first end portion 40 and a second end portion 41. The first end portion 40 of the second gate electrode 31 is positioned on an opening side of the gate trench 28. The second end portion 41 of the second gate electrode 31 is positioned on the bottom-surface side of the gate trench 28.

The first end 40 of the second gate electrode 31 protrudes toward the first-surface-24 side of the epitaxial layer 21 with respect to the second portion 39 of the gate insulating film 29. Hence, a concave portion 42 is formed on both of the first end 40 of the second gate electrode 31, Additionally, the first end 40 of the second gate electrode 31 has a width smaller than that of the second end 41.

The second end portion 41 of the second gate electrode 31 is formed in a convex curved shape that swells toward the bottom surface of the gate trench 28. More specifically, the second end portion 41 of the second gate electrode 31 is formed along a bottom surface of a U-shaped space demarcated by the second portion 39 of the gate insulating film 29, and is formed in a smooth convex curved shape directed toward the bottom surface of the gate trench 28.

The thus formed structure makes it possible to suppress a localized electric-field concentration on the second gate electrode 31, and hence makes it possible to suppress a decrease in breakdown voltage.

The second gate electrode 31 may include at least one kind among electroconductive polysilicon, tungsten, aluminum, copper, an aluminum alloy, and a copper alloy. In the present preferred embodiment, the second gate electrode includes electroconductive polysilicon. The electroconductive polysilicon may include n type impurities or p type impurities.

The first gate electrode 30 is embedded in the opening side of the gate trench 28 across the first portion 38 of the gate insulating film 29. The first gate electrode 30 is embedded in the concave portion 42 of the second gate electrode 31 across the first end portion 40 of the second gate electrode 31.

The first gate electrode 30 may include at least one kind among electroconductive polysilicon, tungsten, aluminum, copper, an aluminum alloy, and a copper alloy. In the present preferred embodiment, the first gate electrode 30 includes electroconductive polysilicon. The electroconductive polysilicon may include n type impurities or p type impurities.

A part exposed from the gate trench 28 in the first gate electrode 30 is covered with a cap insulating film 43. The cap insulating film 43 is continuous with the first portion 38 of the gate insulating film 29 in the gate trench 28. The cap insulating film 43 may include silicon oxide ($SiO_2$)

An intermediate insulating film 44 is formed between the first gate electrode 30 and the second gate electrode 31. The intermediate insulating film 44 electrically insulates the first gate electrode 30 and the second gate electrode 31.

More specifically, the intermediate insulating film 44 covers an outer surface of the first end portion 40 of the second gate electrode 31 exposed from the second portion 39 of the gate insulating film 29 in a region between the second gate electrode 31 and the first gate electrode 30. The intermediate insulating film 44 is continuous with the first portion 38 and the second portion 39 of the gate insulating film 29. Additionally, the thickness of the intermediate insulating film 44 may be, for example, 500 Å to 15000 Å.

The intermediate insulating film 44 may be made of, for example, a silicon oxide film, a silicon nitride film, a silicon oxynitride film, a hafnium oxide film, an alumina film, a tantalum oxide film, etc.

Referring to FIG. 3, the first gate electrode 30 is divided by a first extension portion 45 of the second gate electrode 31 in a halfway portion in the length direction of the gate trench 28. More specifically, the first extension portion 45 extending in the depth direction of the gate trench 28 is formed from the first surface 24 of the epitaxial layer 21 to the second gate electrode 31 in the halfway portion in the length direction of the gate trench 28.

The first extension portion 45 is formed integrally with the second gate electrode 31, and passes the vicinity of a termination 46 of the first gate electrode 30 in the thickness direction of the epitaxial layer 21, and extends to the first surface 24 of the epitaxial layer 21. The first extension portion 45 comes into contact with the source electrode film 4, and secures electrical continuity between these constituents. Therefore, the first extension portion 45 may be referred to as a contact portion of the second gate electrode 31.

Additionally, an extending portion of the second portion 39 of the gate insulating film 29 is interposed between the first extension portion 45 and the side surface of the gate trench 28. In other words, the second portion 39 of the gate insulating film 29 is formed around the first extension portion 45 except the intermediate insulating film 44 interposed at a boundary portion with the first gate electrode 30.

An extension structure of the second gate electrode 31 that is identical in structure to the first extension portion 45 is also formed in the vicinity of a termination 47 on the outer-peripheral-portion-23 side in the length direction of the first gate electrode 30. In other words, the second extension portion 48 extending from the first surface 24 of the epitaxial layer 21 to the second gate electrode 31 in the depth direction of the gate trench 28 is formed in a termination 49 in the length direction of the gate trench 28 as shown in FIG. 2, FIG. 4, and FIG. 5.

The second extension portion 48 is formed integrally with the second gate electrode 31, and passes the vicinity of the termination 47 of the first gate electrode 30 in the thickness direction of the epitaxial layer 21, and extends to the first surface 24 of the epitaxial layer 21. In the present preferred embodiment, the second extension portion 48 is formed directly under a pair of first finger portions of the first gate electrode film 5 formed at the circumferential edge of the semiconductor device 1 in a plan view. Only the second extension portion 48 formed directly under the first finger portion 10 on one side is shown in FIG. 2, FIG. 4, and FIG. 5.

Additionally, an extending portion of the second portion 39 of the gate insulating film 29 is interposed between the second extension portion 48 and the side surface of the gate trench 28, In other words, referring to FIG. 4 and FIG. 6, the second portion 39 of the gate insulating film 29 is formed around the second extension portion 48 except the intermediate insulating film 44 interposed at the boundary portion with the first gate electrode 30.

Referring to FIG. 6, a part exposed from the gate trench 28 in the second extension portion 48 is covered with a cap insulating film 50, The cap insulating film 50 is continuous with the second portion 39 of the gate insulating film 29 in the gate trench 28. The cap insulating film 50 may include silicon oxide ($SiO_2$).

In the single gate trench 28, the first gate electrode 30 is disposed between the second extension portion 48 formed at the termination 49 on one side in the length direction of the gate trench 28 and the first extension portion 45 formed at the middle in the length direction of the gate trench 28, and is disposed between the first extension portion 45 and the second extension portion 48 formed at the termination 49 on the other side in the length direction of the gate trench 28 as a result of the formation of the first and second extension portions 45 and 48 in the present preferred embodiment.

As described later, the first gate electrode 30 faces a basic structure of the MISFET 2 including the $n^-$ type drift layer 27, the p type channel region 32, and the $n^+$ type source region 33, and therefore, a range in which the first gate electrode 30 is formed is defined as the element portion 22 in the present preferred embodiment. Referring to FIG. 4, the boundary between the termination 47 on the outer-peripheral side of the first gate electrode 30 and the second extension portion 48 is the boundary between the element portion 22 and the outer peripheral portion 23. Therefore, a region positioned on a more inward side than the termination 47 on the outer-peripheral side of the first gate electrode 30 is defined as the element portion 22, and a region positioned on a more outward side than the termination 47 on the outer-peripheral side of the first gate electrode 30 is defined as the outer peripheral portion 23. If the termination 49 of the gate trench 28 and the termination 47 of the first gate electrode 30 coincide with each other, the termination 49 of the gate trench 28 may be defined as the boundary between the element portion 22 and the outer peripheral portion 23.

The gate trench 28 has a width in the element portion 22 and a width in the outer peripheral portion 23 that differ from each other. In the present preferred embodiment, the gate trench 28 includes a first portion 51 that has a first width W1 in which the first gate electrode 30 is embedded in the element portion 22 and a second portion 52 that is formed in the outer peripheral portion 23 and that has a second width W2 larger than the first width. In the present preferred embodiment, a separation structure of the first and second gate electrodes 30 and 31 is formed in the first portion 51 of the gate trench 23, and the second extension portion 48 of the second gate electrode 31 is formed in the second portion 52 of the gate trench 28.

For example, the width W1 of the first portion 51 of the gate trench 28 may be 0.3 μm to 2.3 μm, and the width W2 of the second portion 52 of the gate trench 28 may be 1.0 μm to 2.5 μm. The range of the widths W1 and W2 is merely an example, and it recommended to set an appropriate magnitude in consideration of the specific resistance, etc., of the epitaxial layer 21.

Additionally, a width W3 of a part (a mesa portion 53 of the element portion 22 in FIG. 5) of the epitaxial layer 21 between the first portions 51 of the adjoining gate trenches 28 may be, for example, 0.3 μm to 1.5 μm. A width W4 of a part (a mesa portion 54 of the outer peripheral portion 23 in. FIG. 6) of the epitaxial layer 21 between the second portions 52 of the adjoining gate trenches 28 is smaller than the width W3, and may be, for example, 0.2 μm to 1.0 μm.

When the MISFET 2 is operated (i.e., when the gate is controlled to reach an ON state), a gate voltage may be applied to the second gate electrode 31, and a gate voltage may be applied to the first gate electrode 30. In this case, the second gate electrode 31 and the first gate electrode 30 each function as a gate electrode. This makes it possible to suppress a decrease in voltage between the second gate electrode 31 and the first gate electrode 30, hence making it possible to suppress an electric-field concentration between the second gate electrode 31 and the first gate electrode 30. Additionally, it is possible to reduce the on-resistance of the epitaxial layer 21, and therefore it is possible to reduce power consumption.

Additionally, when the MISFET 2 is operated (i.e., when the gate is controlled to reach an ON state), a reference potential may be applied to the second gate electrode 31, and a gate voltage may be applied to the first gate electrode 30. In this case, the second gate electrode 31 functions as a field electrode, whereas the first gate electrode 30 functions as a gate electrode. This makes it possible to reduce parasitic capacitance, hence making it possible to improve switching speed.

The p type channel region 32 is a semiconductor layer into which p type impurities are implanted. More specifically, it may be a semiconductor layer formed by performing ion implantation of p type impurities into the $n^-$ type drift layer 27. B (boron), Al (aluminum), Ga (gallium), etc., can be used as the p type impurities Additionally, the impurity concentration of the p type channel region 32 may be, for example, approximately $1.0 \times 10^{15}$ $cm^{-3}$ to $1.0 \times 10^{19}$ $cm^{-3}$.

The p type channel region 32 is selectively formed at the first surface 24 of the $n^-$ type drift layer 27 at the side of the gate trench 28. In the present preferred embodiment, the p type channel regions 32 are formed in a stripe manner along the gate trench 28 as shown in FIG. 4. In the present preferred embodiment, the p type channel region 32 is formed only in the mesa portion 53 between the first portions 51 of the gate trenches 28, and has a termination 55 that coincides with the termination 47 of the first gate electrode 30 as shown in. FIG. 4 and FIG. 7. In other words, the p type channel region 32 has the termination 55 that coincides with the boundary between the element portion 22 and the outer peripheral portion 23.

Additionally, referring to FIG. 7, the distance L1 from the termination 49 of the gate trench 28 in the X direction to the termination 55 of the p type channel region 32 may be, for example, 3 μm to 15 μm.

The $n^+$ type source region 33 is selectively formed at a surface portion of the p type channel region 32. In other words, the $n^+$ type source region 33 is formed in a stripe manner along the gate trench 28 in the same way as the p type channel region 32, The $n^+$ type source region 33 may be formed by selectively performing ion implantation of n type impurities into the p type channel region 32. Examples of the n type impurities are the same as above, Additionally, the impurity concentration of the $n^+$ type source region 33 is higher than the n⁻ type drift layer 27, and may be, for example, approximately $1.0 \times 10^{18}$ cm$^{-3}$ to $5.0 \times 10^{20}$ cm$^{-3}$.

Additionally, in the present preferred embodiment, the n⁺ type source region 33 is formed only in the mesa portion 53 between the first portions 51 of the gate trenches 28, and has a termination 56 positioned on a more inward side than the termination 47 of the first gate electrode 30 as shown in FIG. 4.

Referring to FIG. 2, FIG. 3, and FIG. 5, the n⁺ type source region 33, the p type channel region 32, and the n⁻ type drift layer 27 are formed in this order in the depth direction of the gate trench 28. The first gate electrode 30 faces the n⁺ type source region 33, the p type channel region 32, and the n⁻ type drift layer 27 through the gate insulating film (first portion 38). A part, which faces the first gate electrode 30, of the p type channel region 32 provides a channel forming portion 57 (FIG. 5) of the MISFET 2.

Referring to FIG. 4, an extending portion 58 of the n⁻ type drift layer 27 is formed from the termination 55 of the p type channel region 32 to the termination 49 of the gate trench 28 in the length direction of the gate trench 28. Referring to FIG. 7, the extending portion 58 of the n⁻ type drift layer 27 may be formed at the entirety of the outer peripheral portion 23 while extending around sidewardly from below the p type channel region 32.

The contact trench 34 is formed from the first surface 24 of the epitaxial layer 21 toward the semiconductor substrate 20. The contact trench 34 is formed so as to pass through the n⁺ type source region 33 and so as to reach the p type channel region 32. The contact trench 34 is formed in a stripe manner along the p type channel region 32 as shown in FIG. 2, FIG. 3, and FIG. 4. The contact trench 34 may be formed in a plurality of dots that are arranged with intervals in the length direction of the stripe-shaped p type channel region 32.

The p⁺ type channel contact region 35 is formed at an inner surface of the contact trench 34. The p⁺ type channel contact region 35 may be formed at a side surface of the contact trench 34 in addition to a bottom surface of the contact trench 34 although the p⁺ type channel contact region 35 formed only at the bottom surface of the contact trench 34 is shown in FIG. 5. The p⁺ type channel contact region 35 may be formed by selectively performing ion implantation of p type impurities into the p type channel region 32. Examples of the p type impurities are the same as above. Additionally, the impurity concentration of the p⁺ type channel contact region 35 is higher than the p type channel region 32, and may be, for example, approximately $5.0 \times 10^{17}$ cm$^{-3}$ to $1.0 \times 10^{19}$ cm$^{-3}$.

The interlayer insulating film 36 is formed on the epitaxial layer 21. The interlayer insulating film 36 may be made of an insulating material, for example, silicon oxide film, silicon nitride film, TEOS (tetraethoxysilane), etc.

A first contact hole 59 by which the p⁺ type channel contact region 35 is exposed, a second contact hole 60 by which the first gate electrode 30 is exposed, and a third contact hole 61 by which the first extension portion 45 of the second gate electrode 31 is exposed are formed in the interlayer insulating film 36.

A first plug electrode 62 is embedded in the first contact hole 59, and a second plug electrode 63 is embedded in the second contact hole 60, and a third plug electrode 64 is embedded in the third contact hole 61. The first plug electrode 62 is connected to the p⁺ type channel contact region 35 and to the n⁺ type source region 33, and the second plug electrode 63 is connected to the first gate electrode 30, and the third plug electrode 64 is connected to the first extension portion 45 of the second gate electrode 31. The first plug electrode 62, the second plug electrode 63, and the third plug electrode 64 may each include tungsten.

The aforementioned electrode film 3 is formed on the interlayer insulating film 36. The electrode film 3 may be made of aluminum or other metals.

The source electrode film 4 is electrically connected to the p⁺ type channel contact region 35 and to the n⁺ type source region 33 through the first plug electrode 62. The first gate electrode film 5 (the first finger portion 10) is electrically connected to the first gate electrode 30 through the second plug electrode 63. The source electrode film 4 is electrically connected to the second gate electrode 31 through the third plug electrode 64. The source electrode film 4 may be referred to simply as a "source electrode."

The drain electrode 37 is formed at the second surface 25 of the semiconductor substrate 20. The drain electrode 37 may be made of aluminum or other metals. The drain electrode 37 is connected to the n⁺ type drain layer 26 in the second surface 25 of the semiconductor substrate 20. Hence, the drain electrode 37 is electrically connected to the n⁻ type drift layer 27 through the n⁺ type drain layer 26.

Next, a method of manufacturing the semiconductor device 1 will be described. FIGS. 8A and 8B to FIGS. 19A and 19B are views to describe a process of manufacturing the semiconductor device 1 in order of process steps. Among FIGS. 8A and 8B to FIGS. 19A and 19B, "A" suffixed to each drawing number denotes a drawing corresponding to FIG. 5 mentioned above, and "B" suffixed to each drawing number denotes a drawing corresponding to FIG. 6 mentioned above.

Figure 8A:
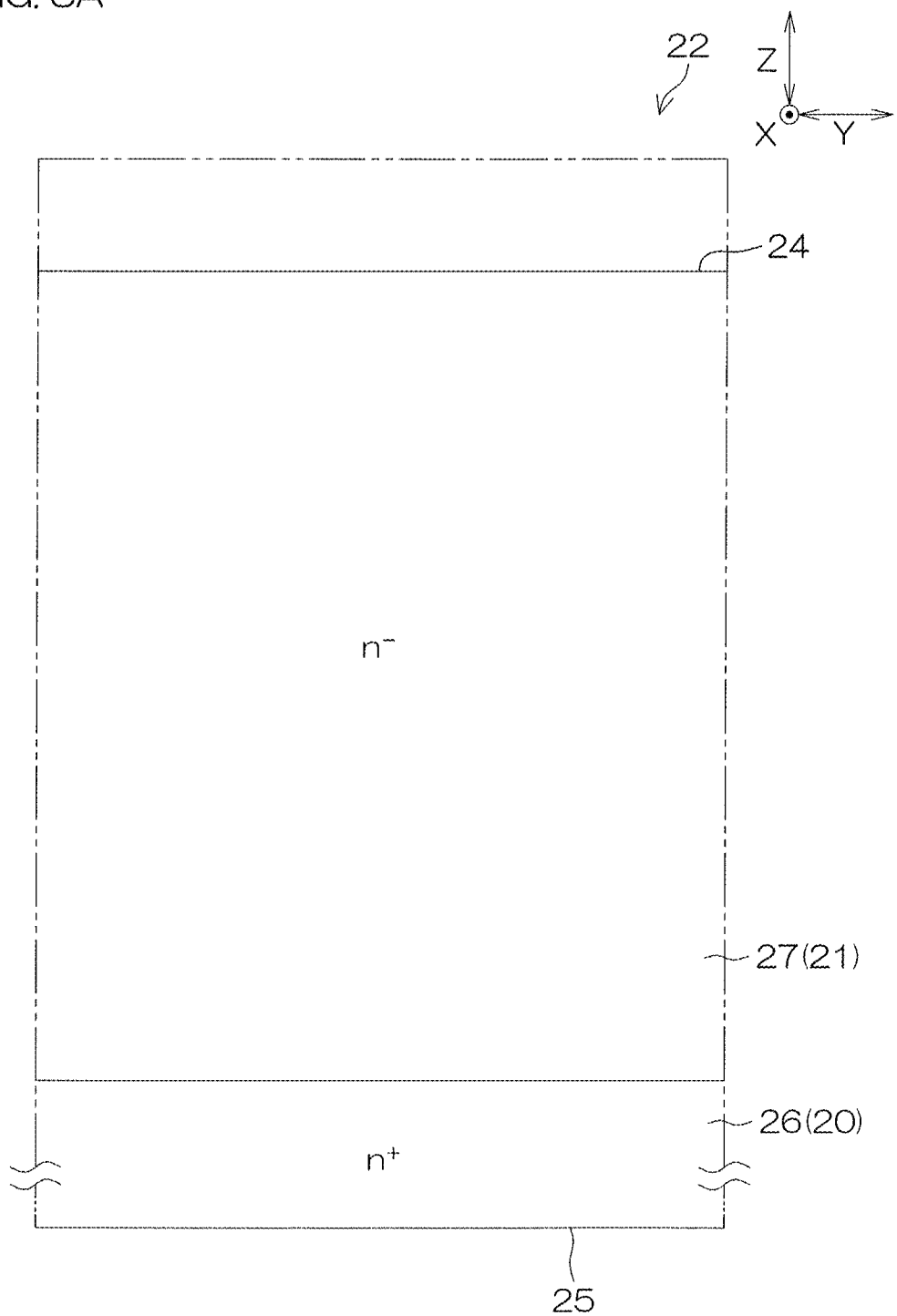
Figure 8B:
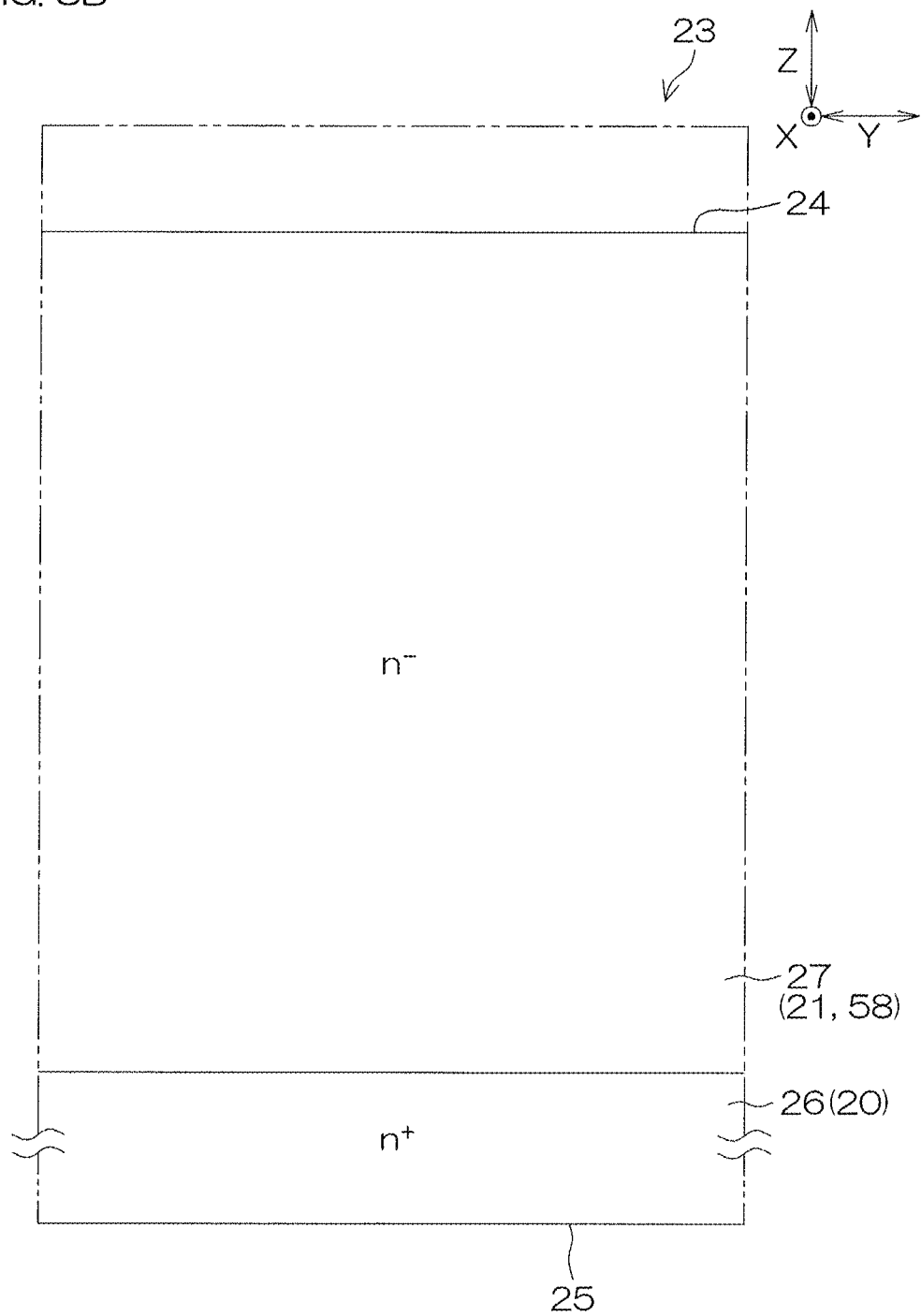

For example, referring to FIGS. 8A and 8B, the epitaxial layer 21 is formed by epitaxially growing silicon on the semiconductor substrate 20 in order to manufacture the semiconductor device 1.

Figure 9A:
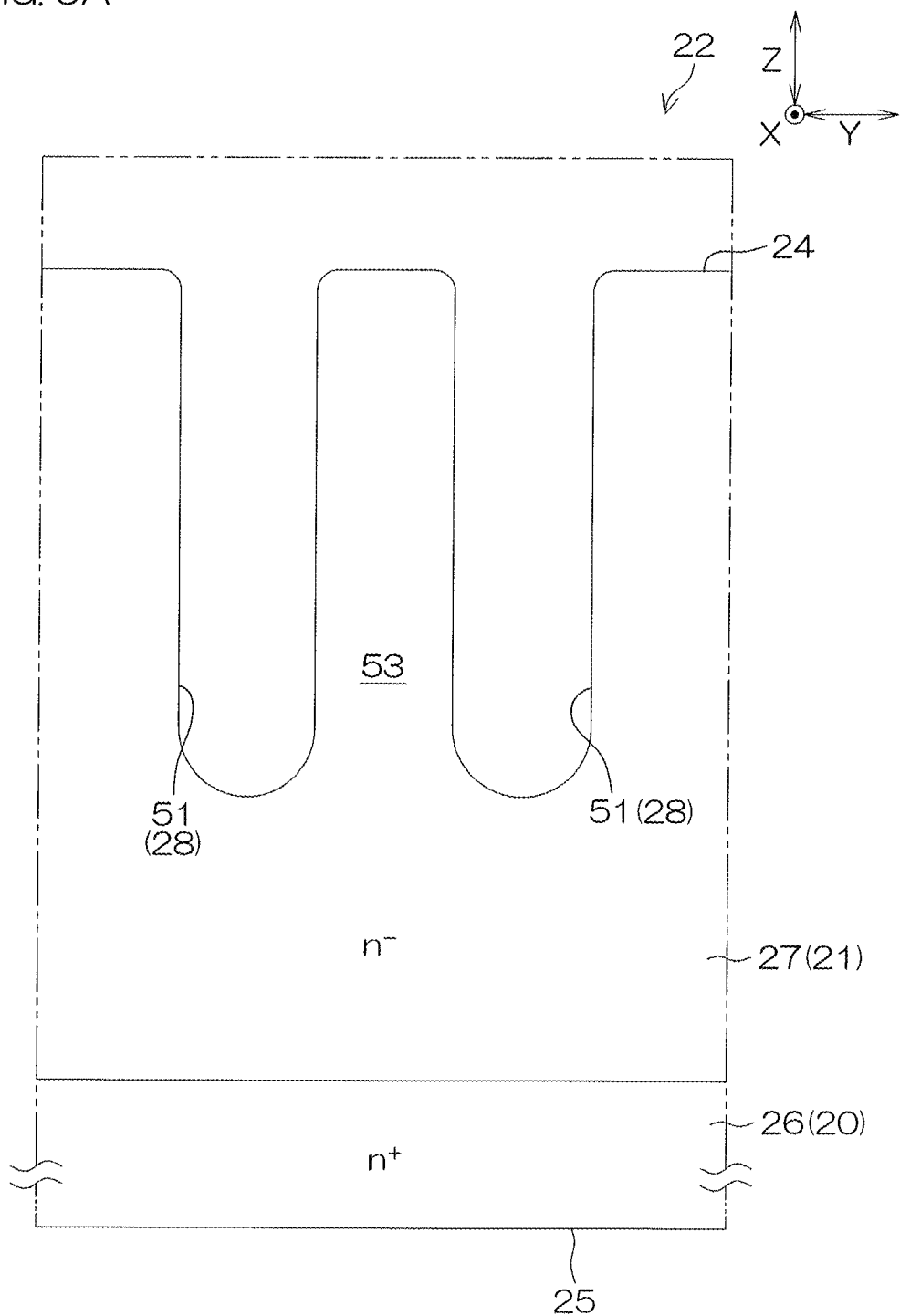
Figure 9B:
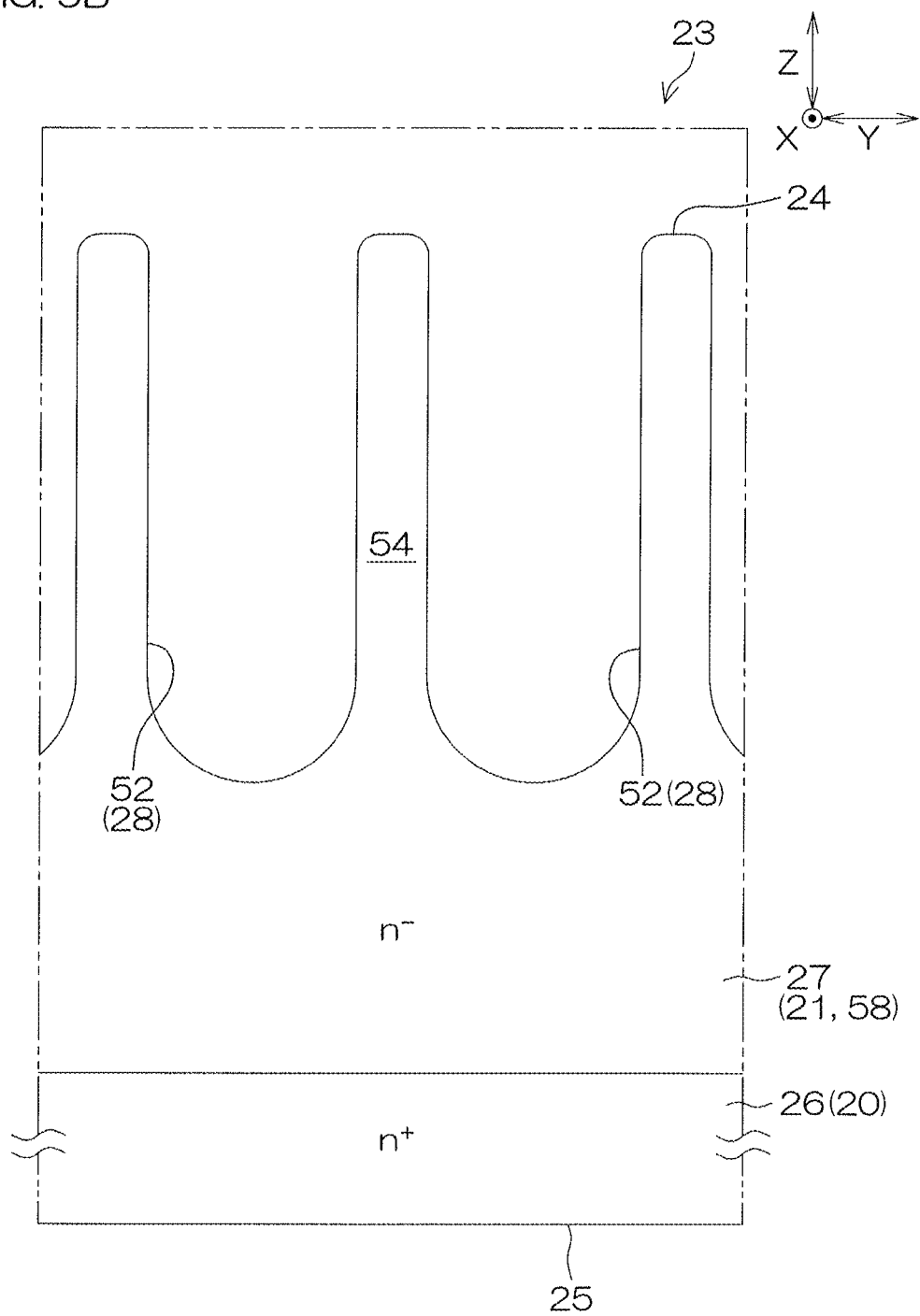

Thereafter, referring to FIGS. 9A and 9B, the gate trench 28 is formed in the epitaxial layer 21. More specifically, a mask (not shown) having a predetermined pattern is formed at the first surface 24 of the epitaxial layer 21, and a needless part of the epitaxial layer 21 is removed according to an etching method through the mask. Hence, the gate trench 28 integrally having the first portion 51 that has a relatively narrow width W1 and the second portion 52 that has a relatively wide width W2 is formed.

Figure 10A:
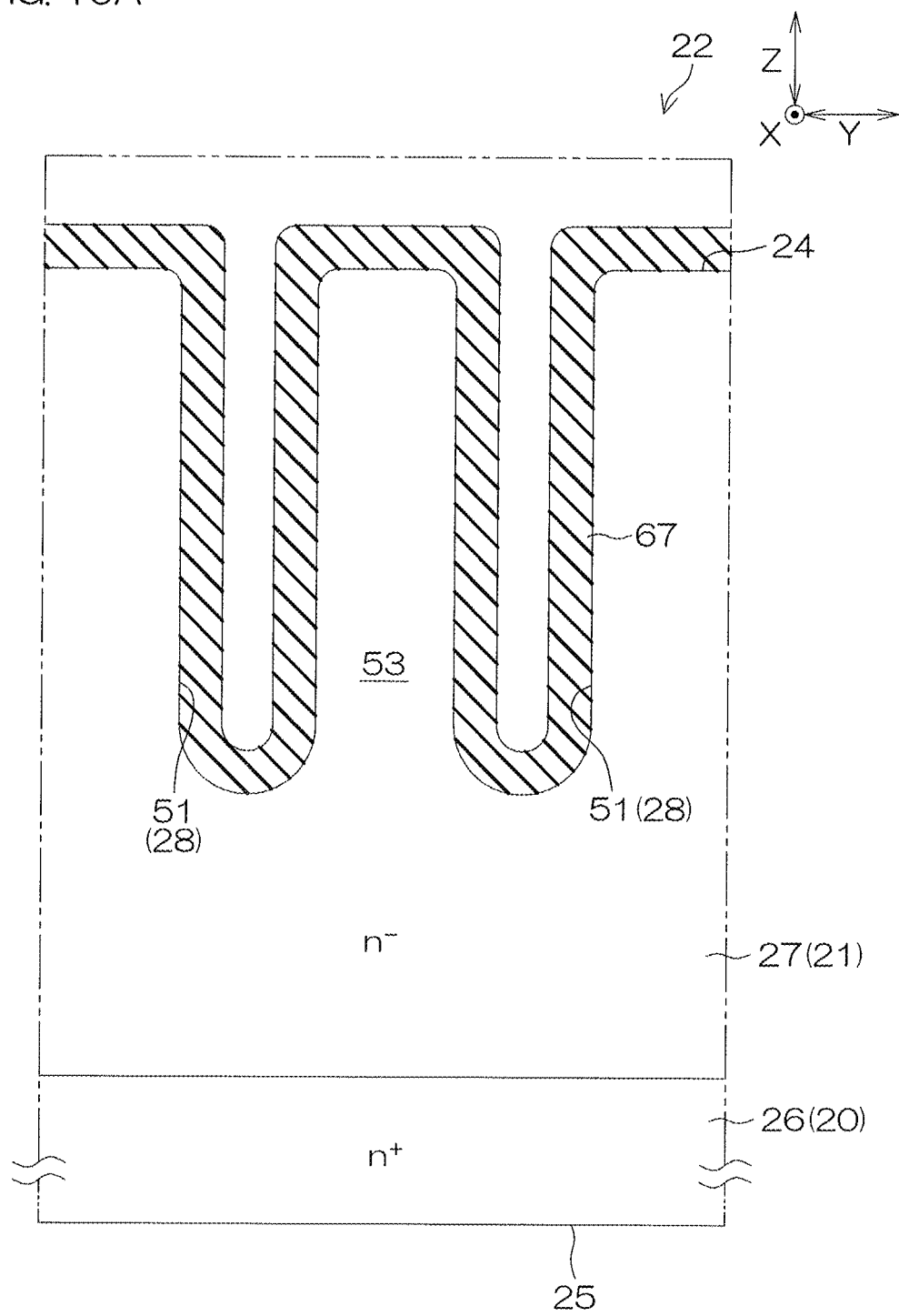
Figure 10B:
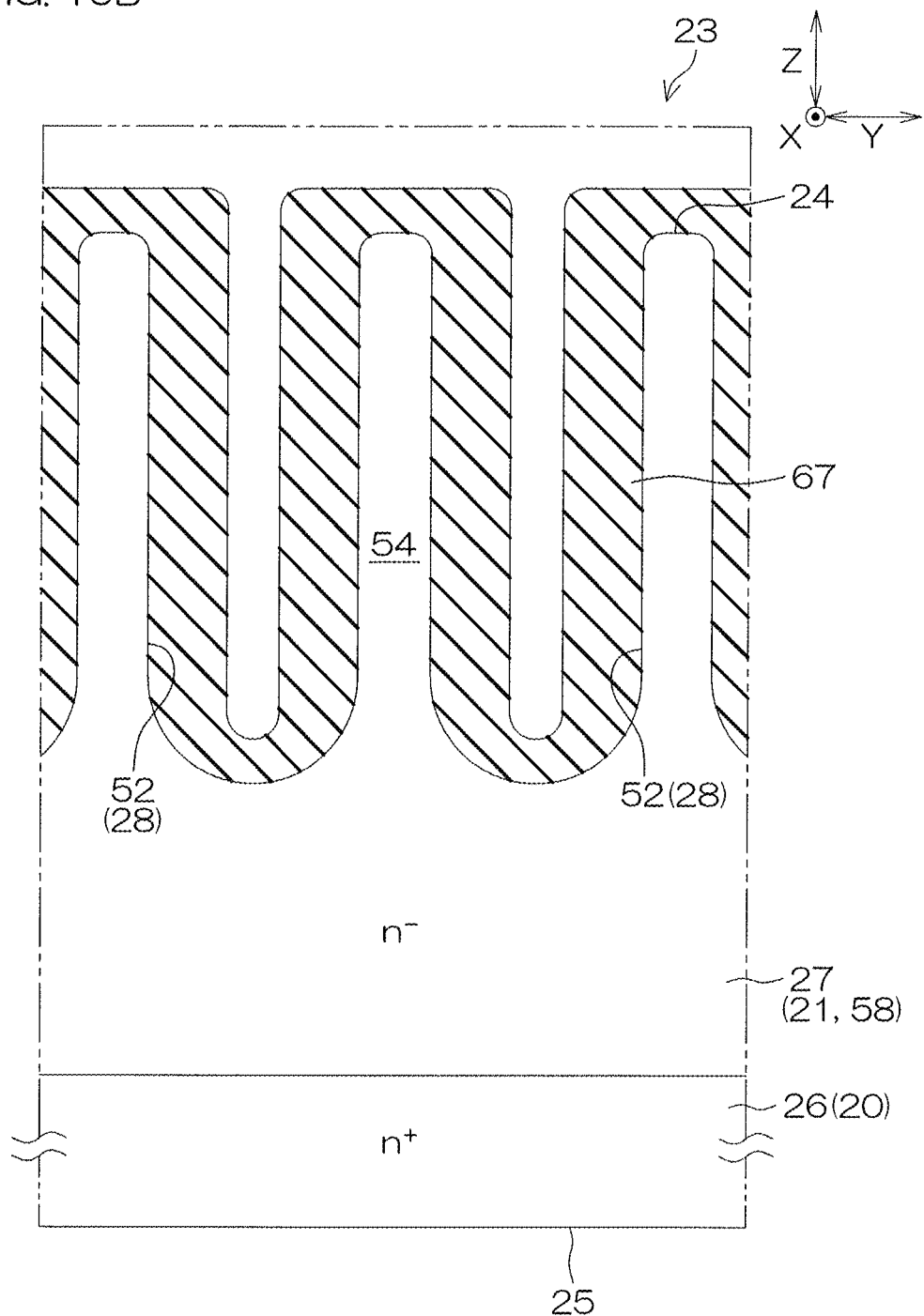

Thereafter, referring to FIGS. 10A and 10B, a base insulating film 67 that serves as a base of the second portion of the gate insulating film 29 is formed. The base insulating film 67 is formed along the first surface 24 of the epitaxial layer 21 and along the inner surface of the gate trench 28. The base insulating film 67 may be formed according to an oxidation treatment method (for example, thermal oxidation treatment method) or a CVD method. In the present preferred embodiment, the base insulating film 67 is formed according to the thermal oxidation treatment method.

Figure 11A:
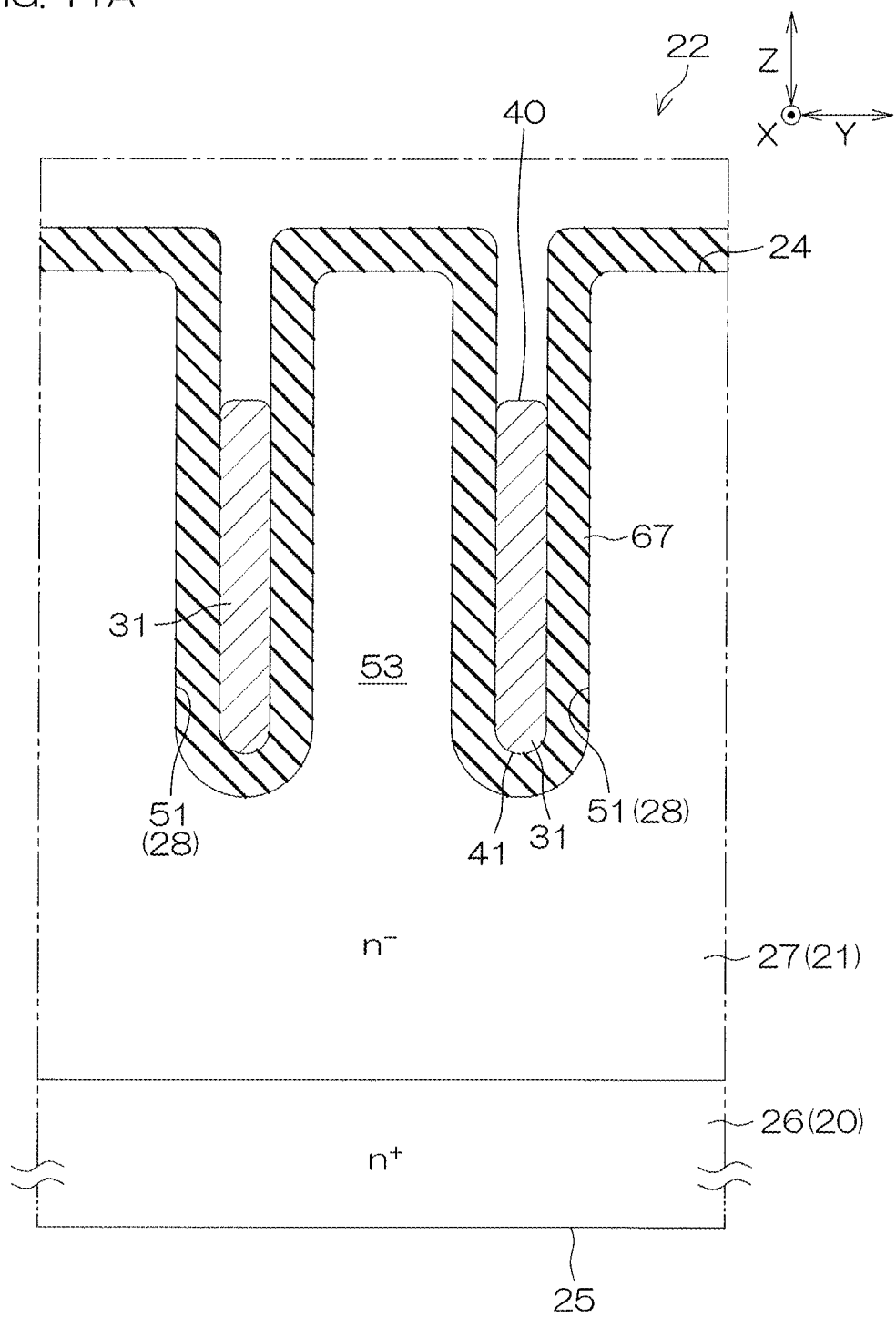
Figure 11B:
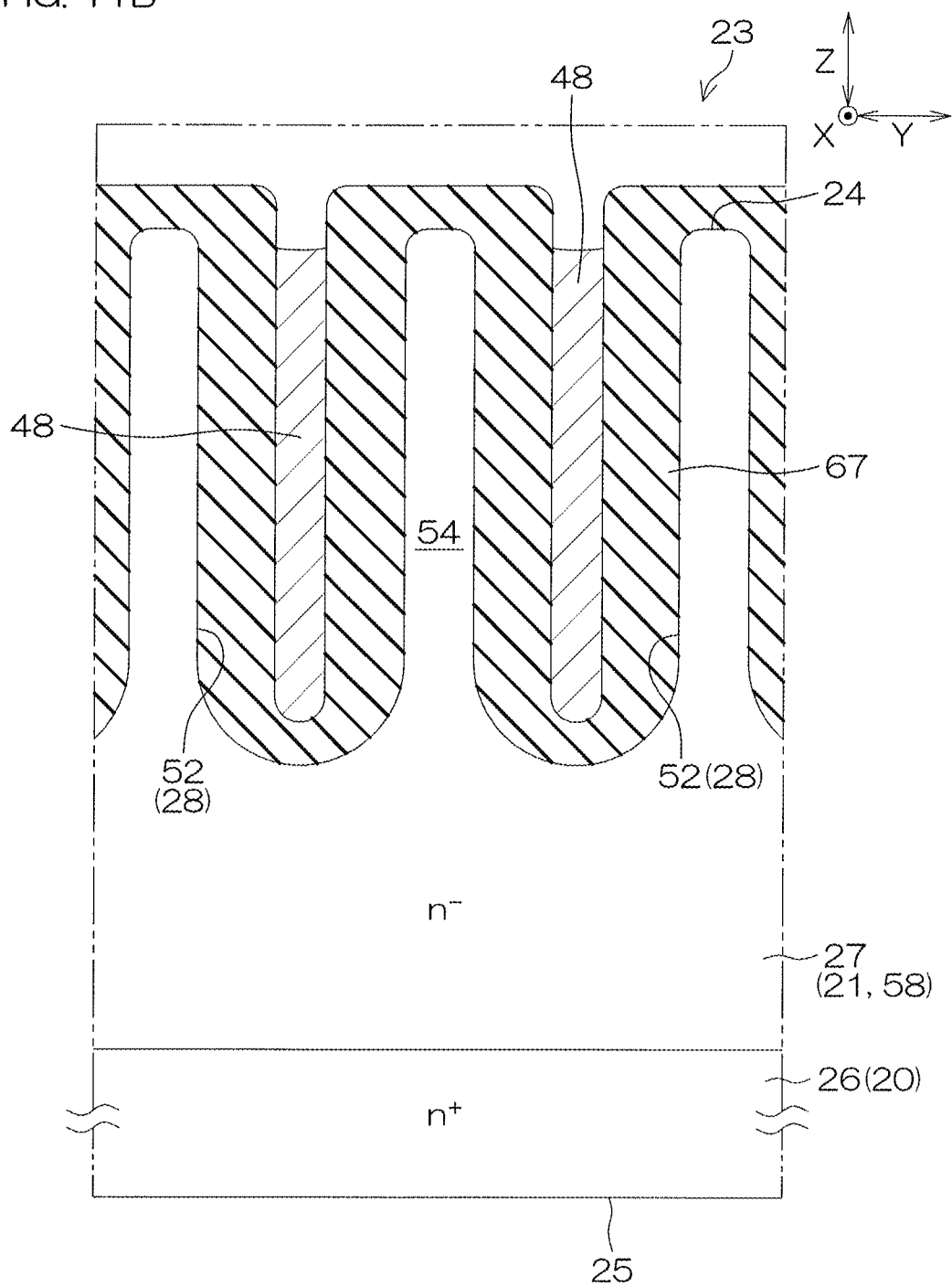

Thereafter, referring to FIGS. 11A and 11B, the second gate electrode 31 is formed. More specifically, a conductive film (in the present preferred embodiment, conductive polysilicon) is formed such that the gate trench 28 is filled with the conductive film and such that the first surface 24 of the epitaxial layer 21 is covered with the conductive film, and thereafter the conductor film is etched, and, as a result, the second gate electrode 31 is obtained.

Figure 12A:
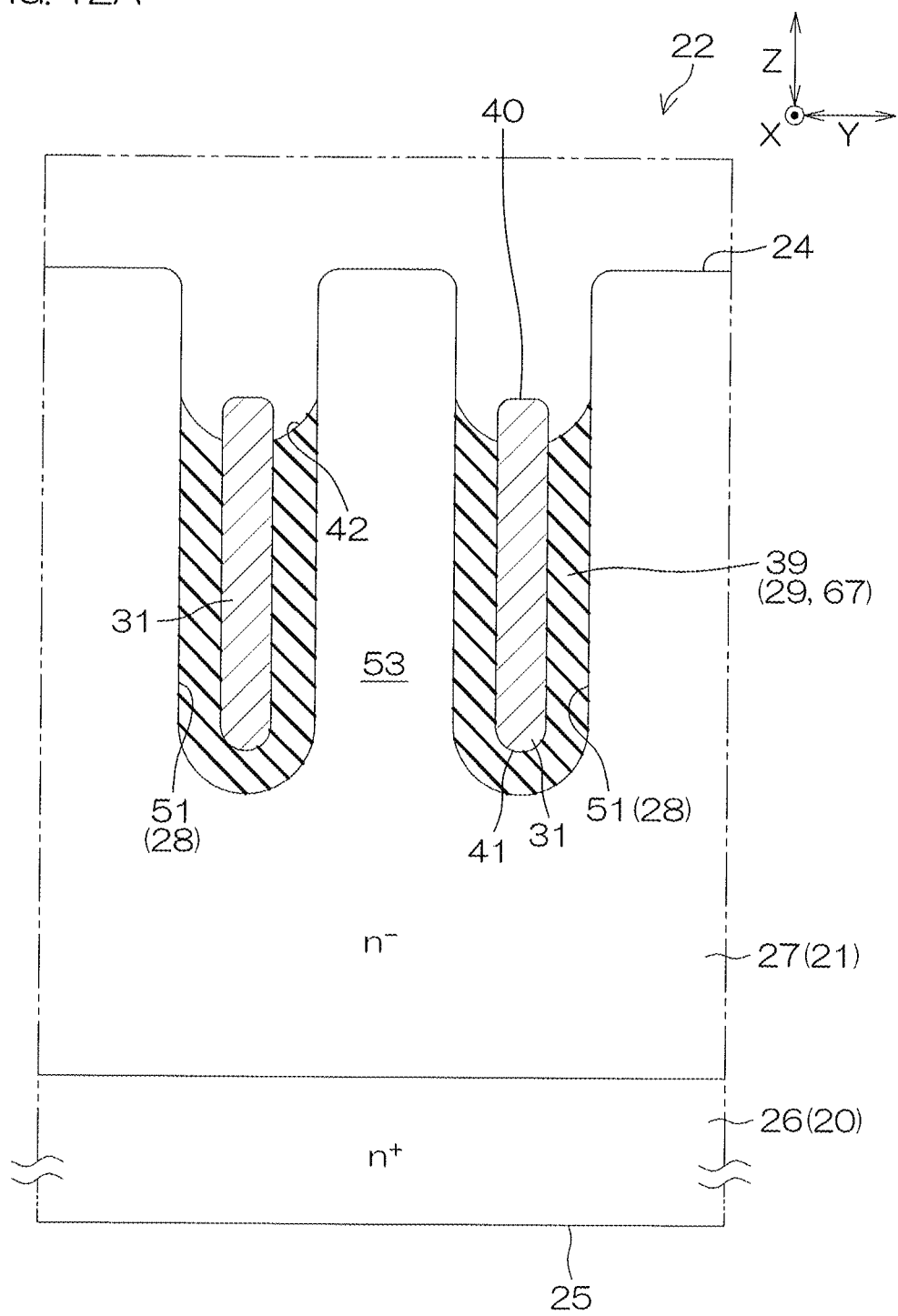
Figure 12B:
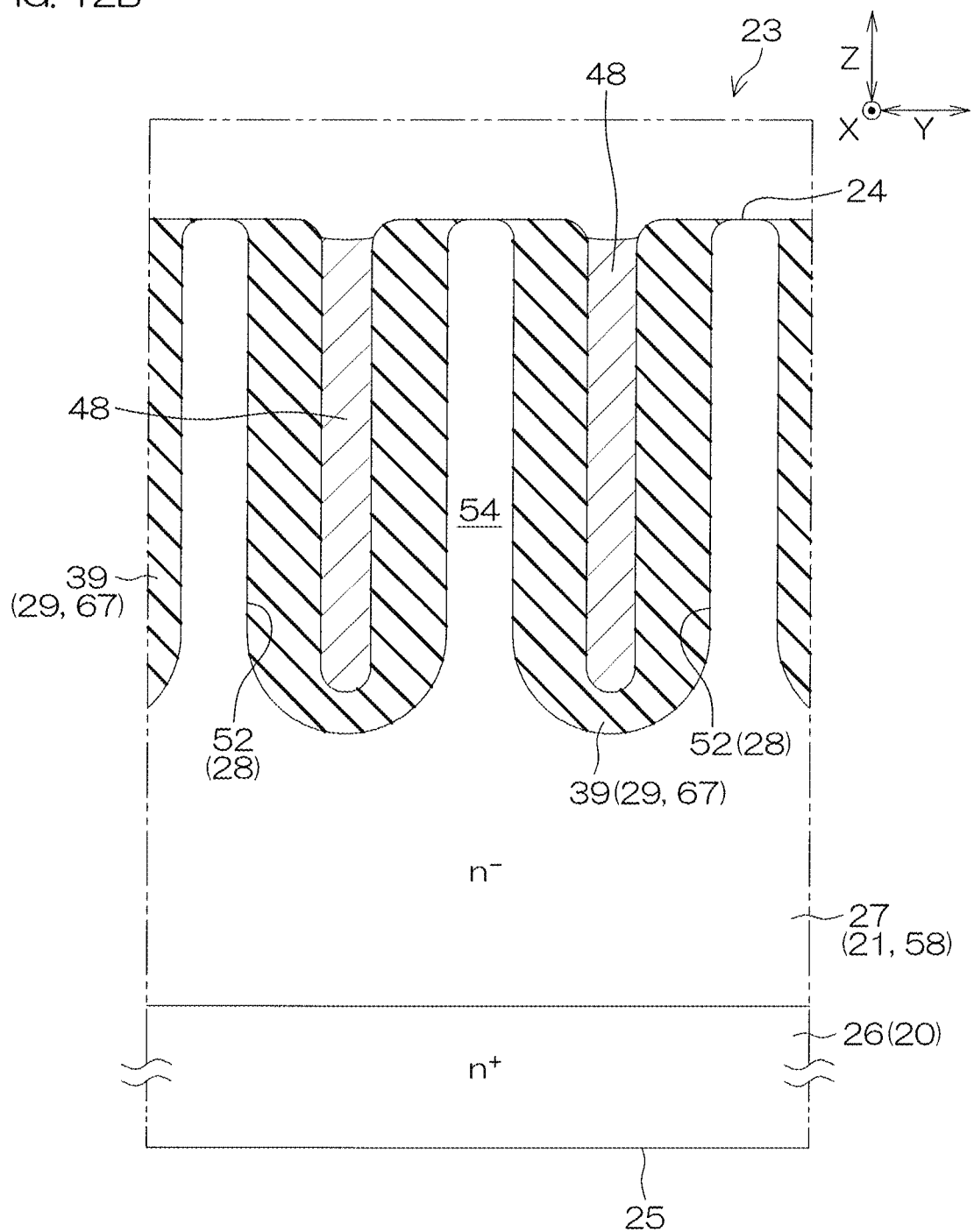

Thereafter, referring to FIGS. 12A and 12B, needless part of the base insulating film 67 is removed. In this step, a mask (not shown) having a predetermined pattern is first formed at the first surface 24 of the epitaxial layer 21. Thereafter, the needless part of the base insulating film 67 is removed according to the etching method through the mask (not shown). Hence, the base insulating film 67 is removed until the first end portion 40 of the second gate electrode 31 is exposed in the gate trench 28. Hence, the second portion 39 of the gate insulating film 29 is formed.

Figure 13A:
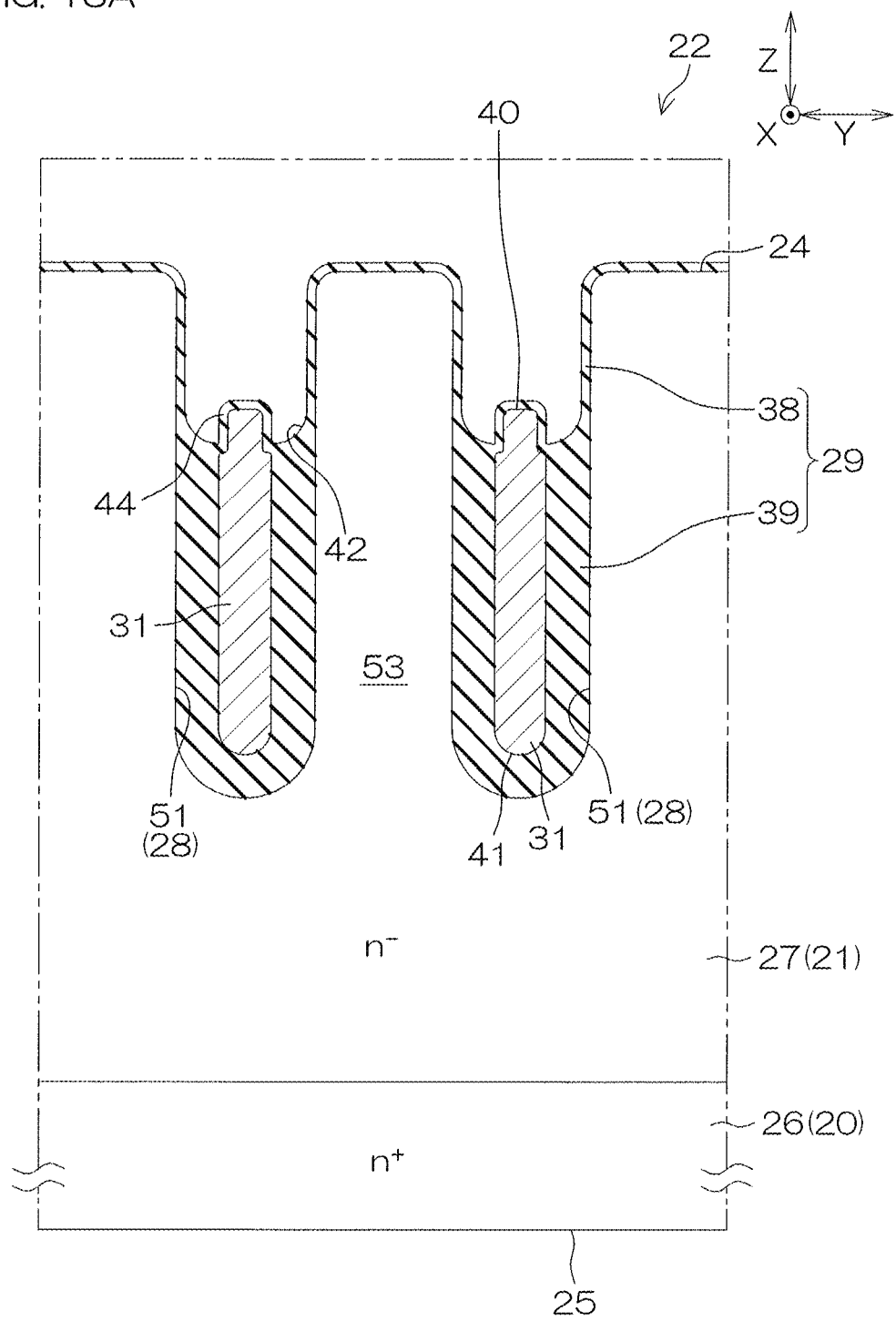
Figure 13B:
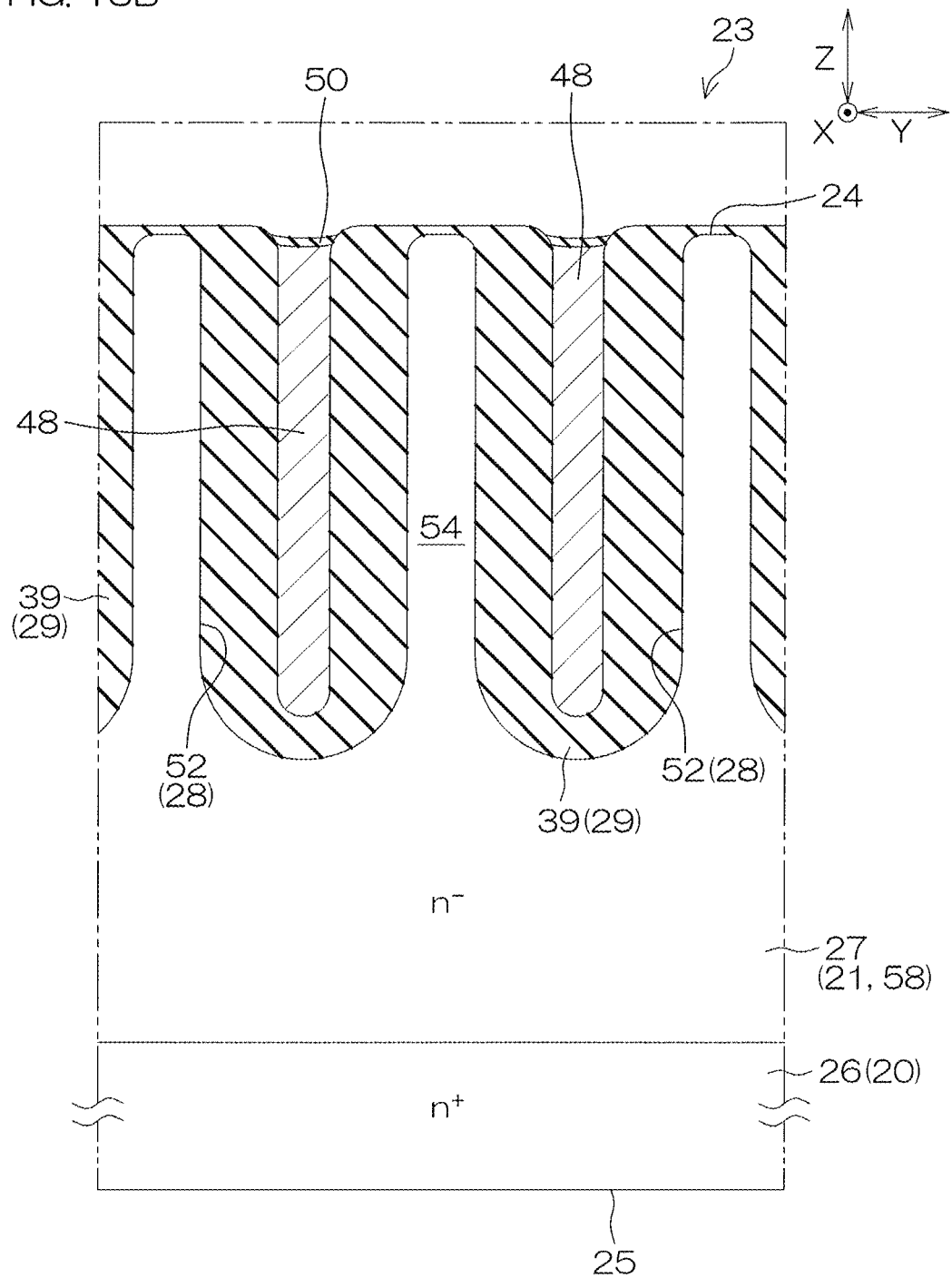

Thereafter, referring to FIGS. 13A and 13B, the first portion 38 of the gate insulating film 29, the intermediate insulating film 44, and the cap insulating film 50 are formed. The first portion 38 of the gate insulating film 29, the intermediate insulating film 44, and the cap insulating film 50 may be formed according to the oxidation treatment method (for example, thermal oxidation treatment method) or the CVD method. In the present preferred embodiment, the first portion 38 of the gate insulating film 29, the intermediate insulating film 44, and the cap insulating film 50 are formed according to the thermal oxidation treatment method.

Figure 14A:
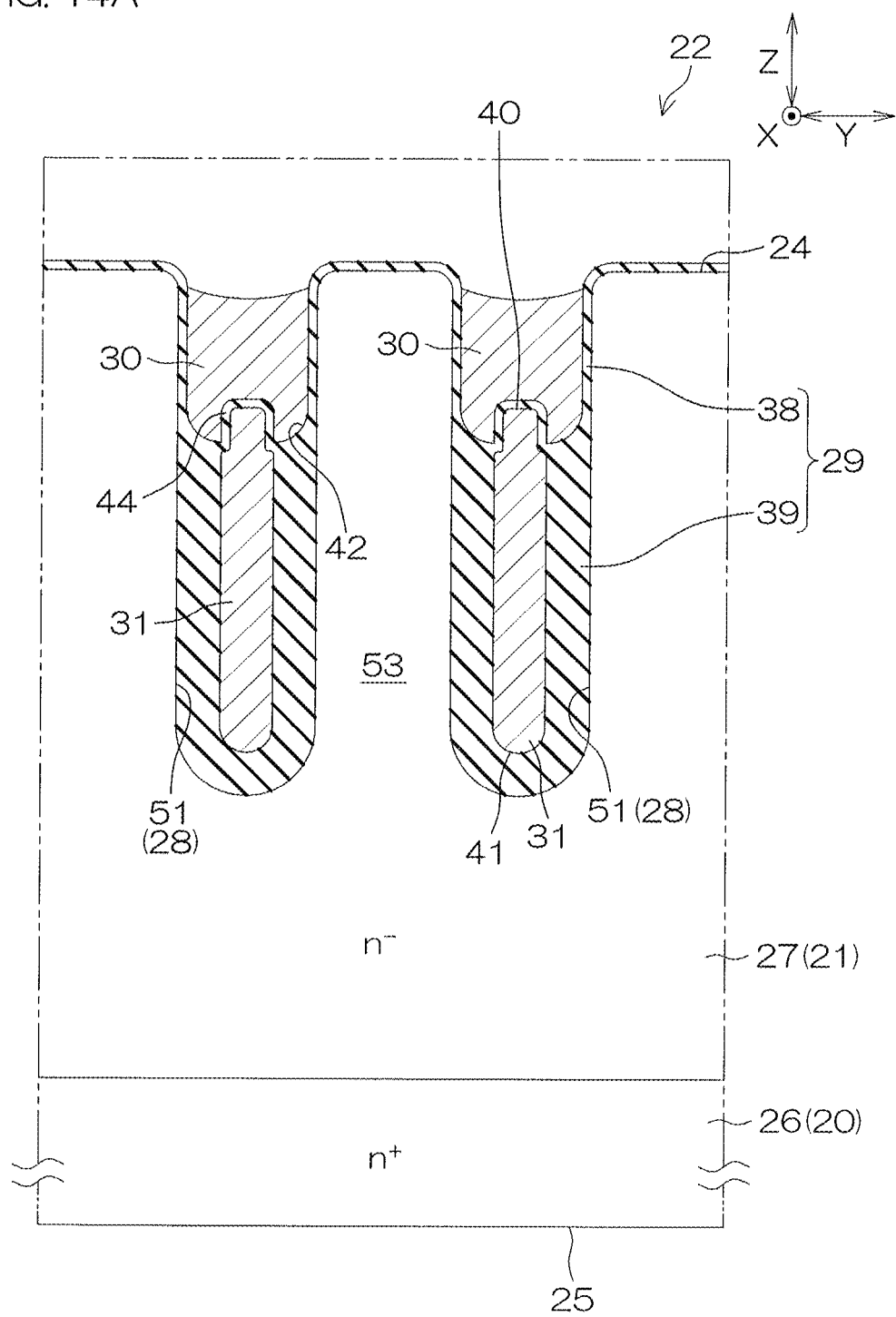
Figure 14B:
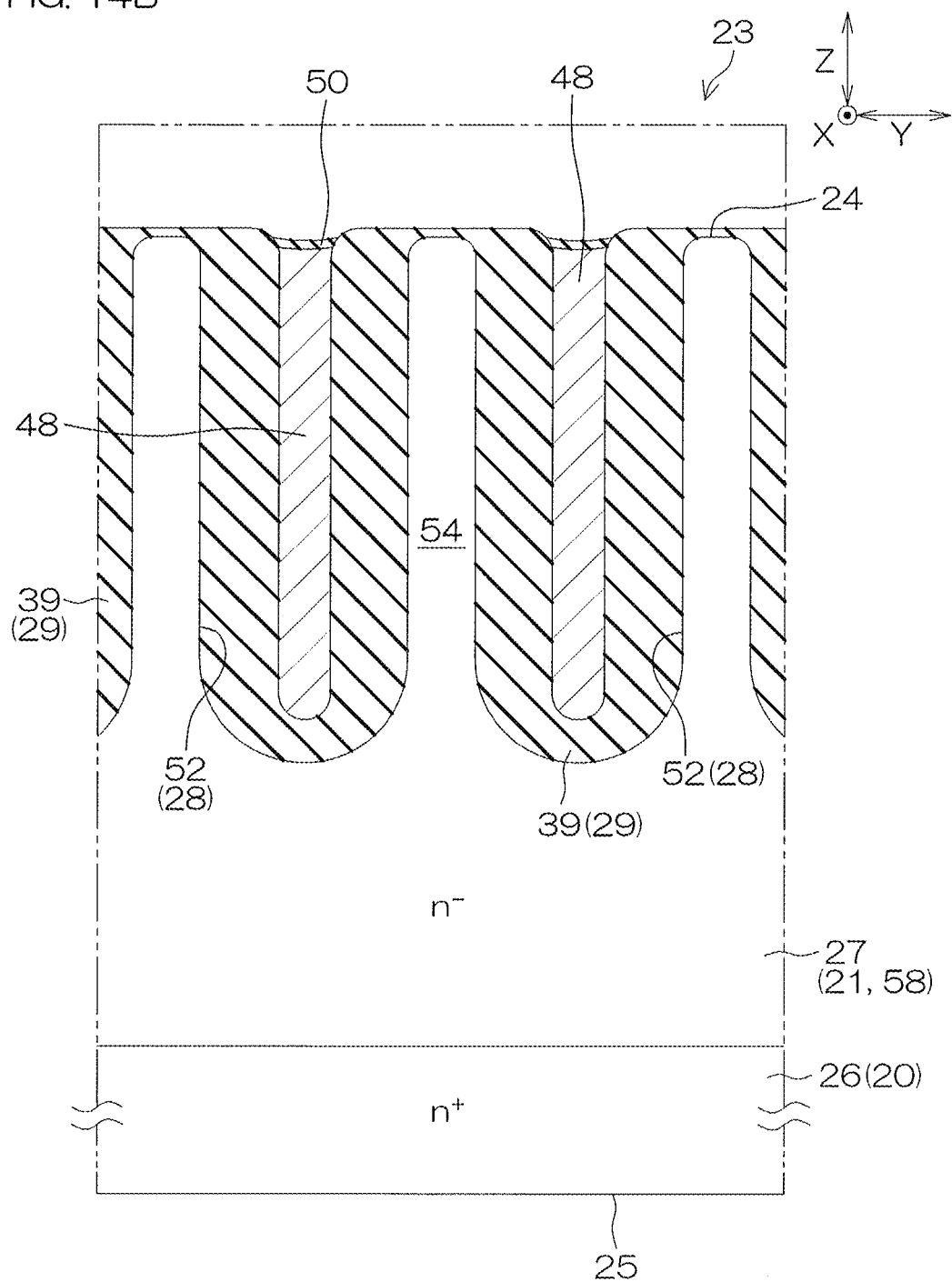

Thereafter, referring to FIGS. 14A and 14B, the first gate electrode 30 is formed. More specifically, a conductive film (in the present preferred embodiment, conductive polysilicon) is formed such that the gate trench 28 is filled with the conductive film and such that the first surface 24 of the epitaxial layer 21 is covered with the conductive film, and thereafter the conductor film is etched, and, as a result, the first gate electrode 30 is obtained.

Figure 15A:
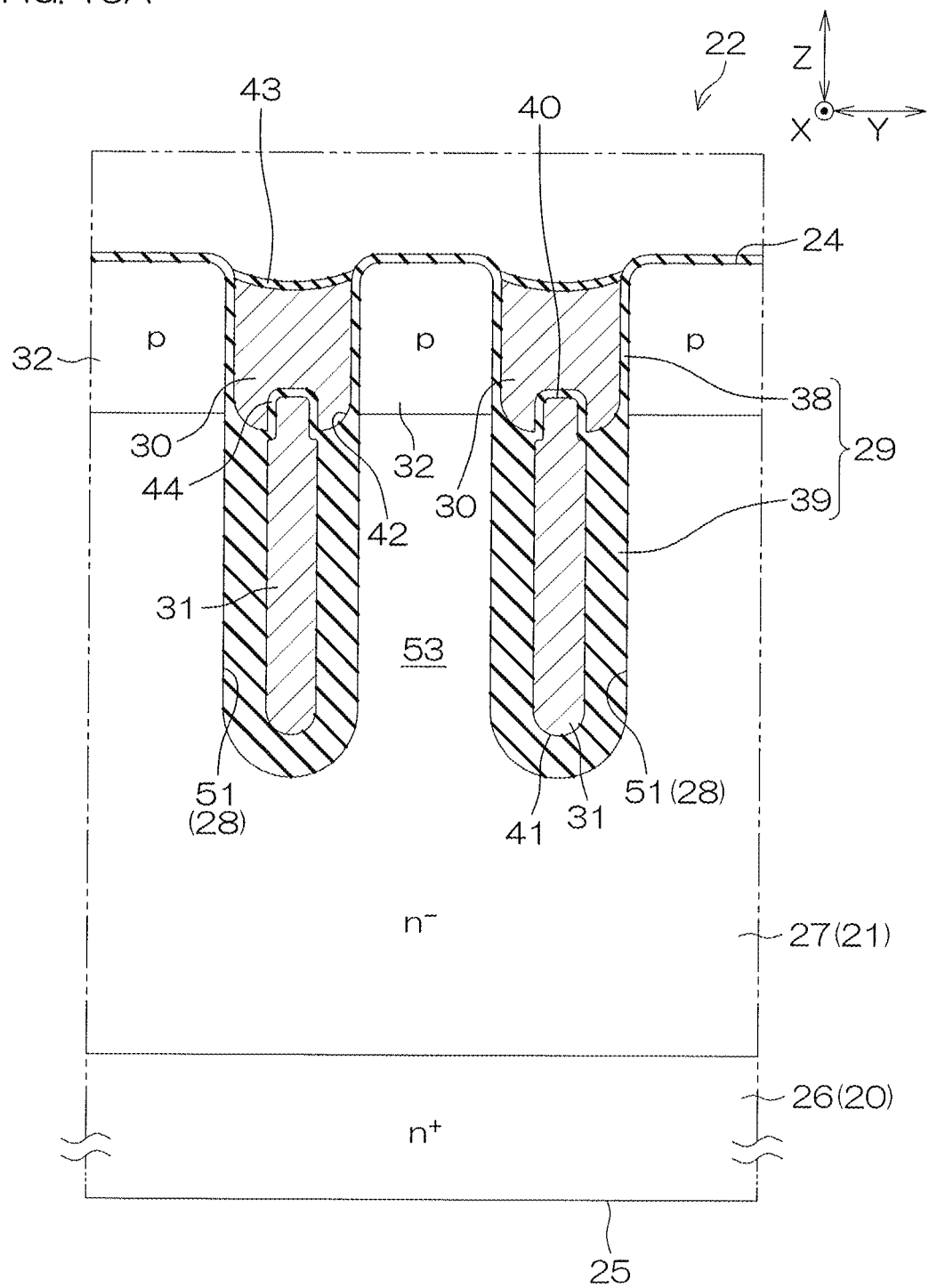
Figure 15B:
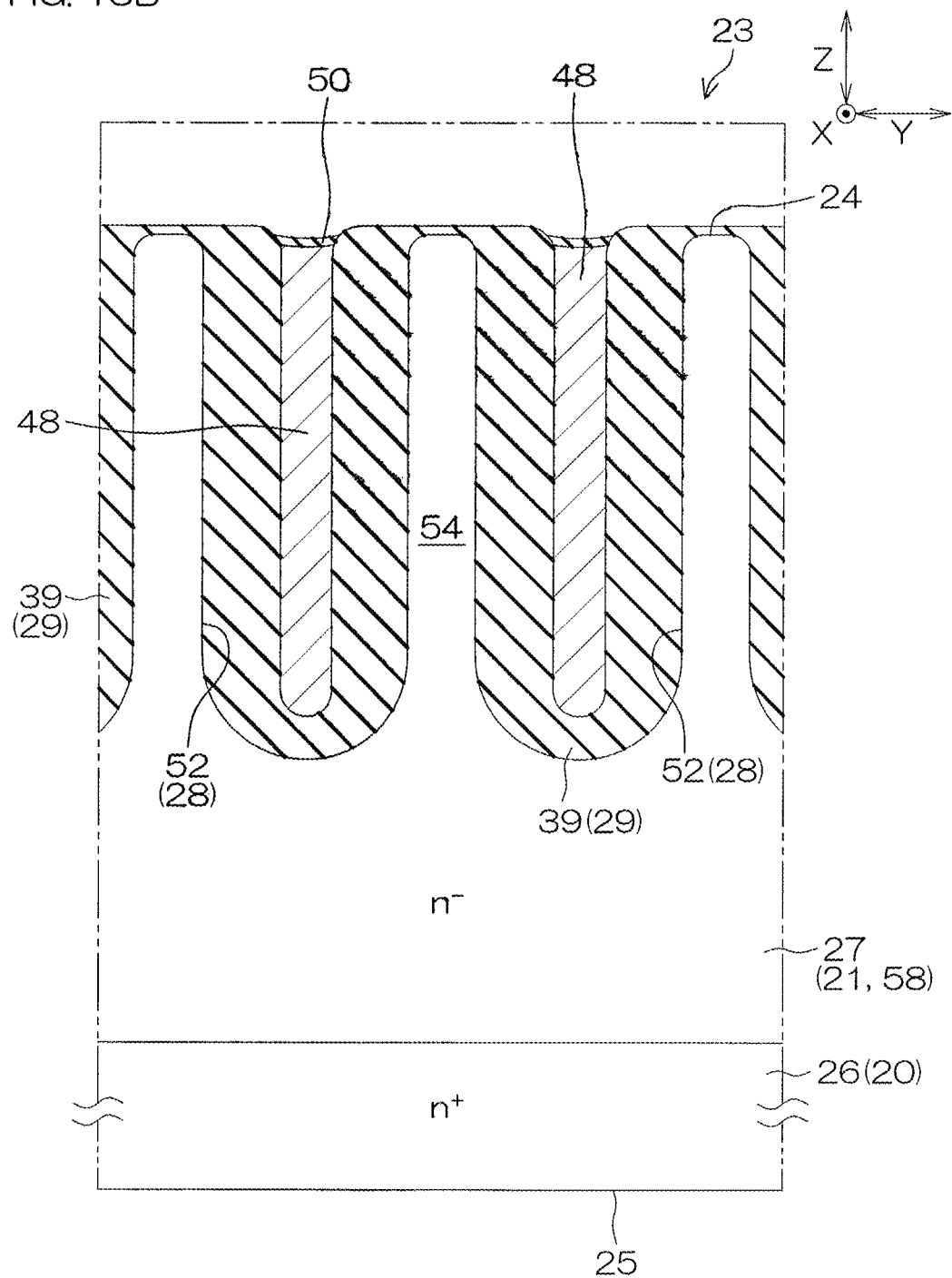

Thereafter, referring to FIGS. 15A and 15B, the cap insulating film 43 with which an exposed portion of the first gate electrode 30 is covered is formed. The cap insulating film 43 may be formed according to, for example, the thermal oxidation treatment method. Thereafter, the p type channel region 32 is formed at a surface layer portion of the first surface 24 of the epitaxial layer 21. The p type channel region 32 is formed by implanting p type impurities into the first surface 24 of the epitaxial layer 21 according to an ion implantation method through an ion implantation mask (not shown).

Figure 16A:
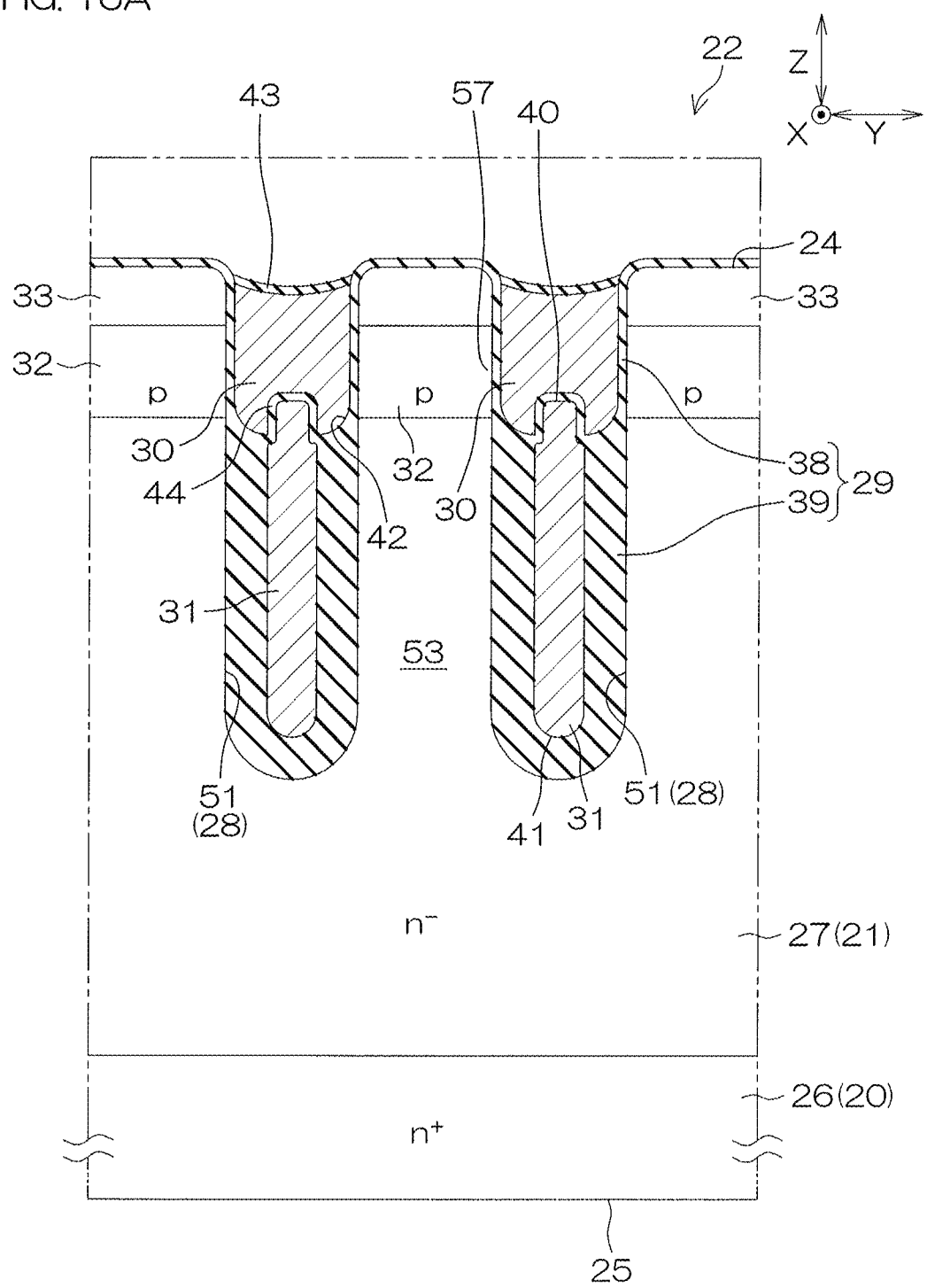

Thereafter, referring to FIGS. 16A and 16B, the $n^+$ type source region 33 is formed at a surface layer portion of the p type channel region 32. The $n^+$ type source region. 33 is formed by implanting n type impurities into the first surface 24 of the epitaxial layer 21 according to the ion implantation method through an ion implantation mask (not shown).

Figure 17A:
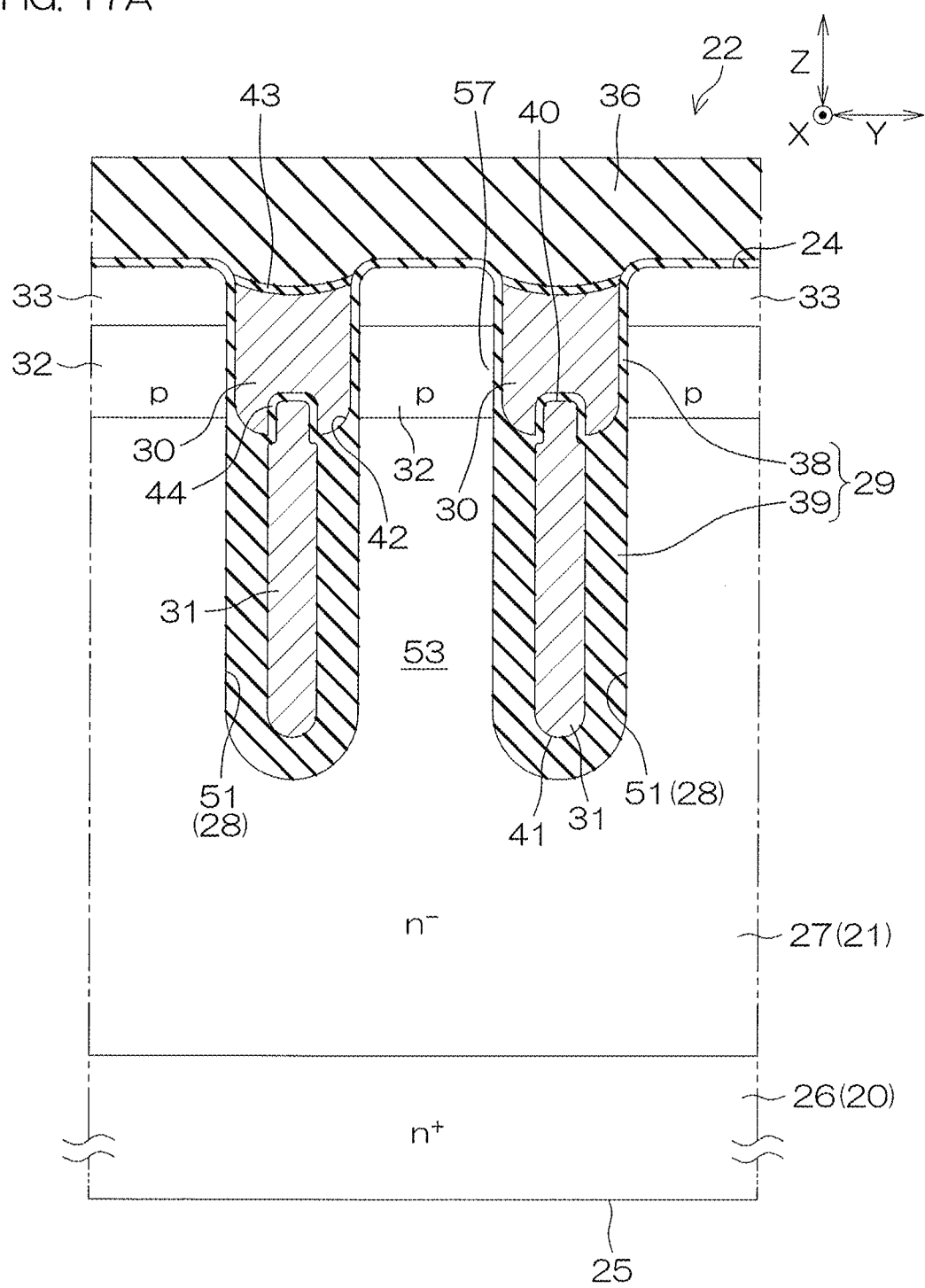
Figure 17B:
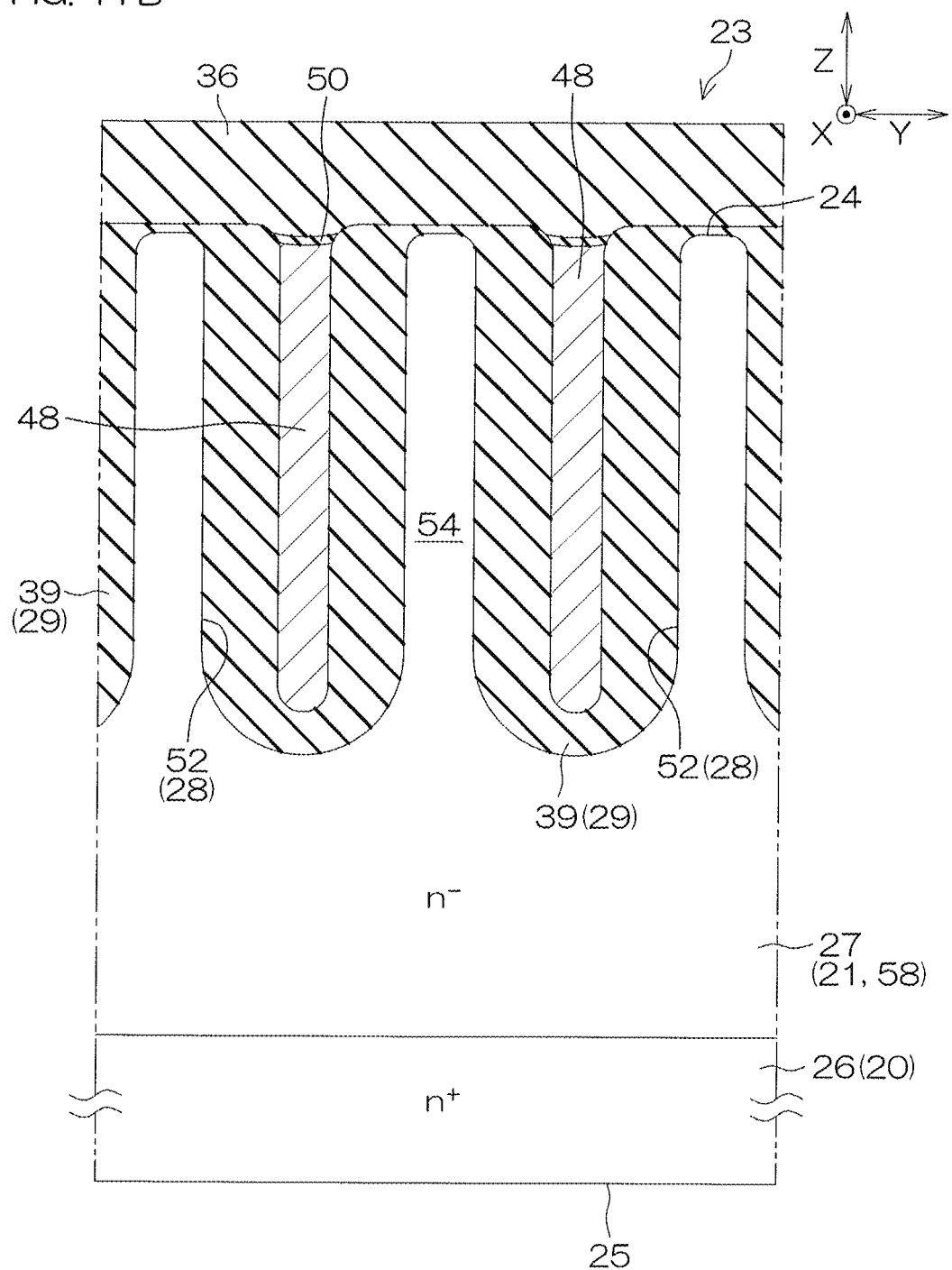

Thereafter, referring to FIGS. 17A and 17B, the interlayer insulating film 36 is formed at the first surface 24 of the epitaxial layer 21. The interlayer insulating film 36 may be formed according to, for example, the CVD method.

Figure 18A:
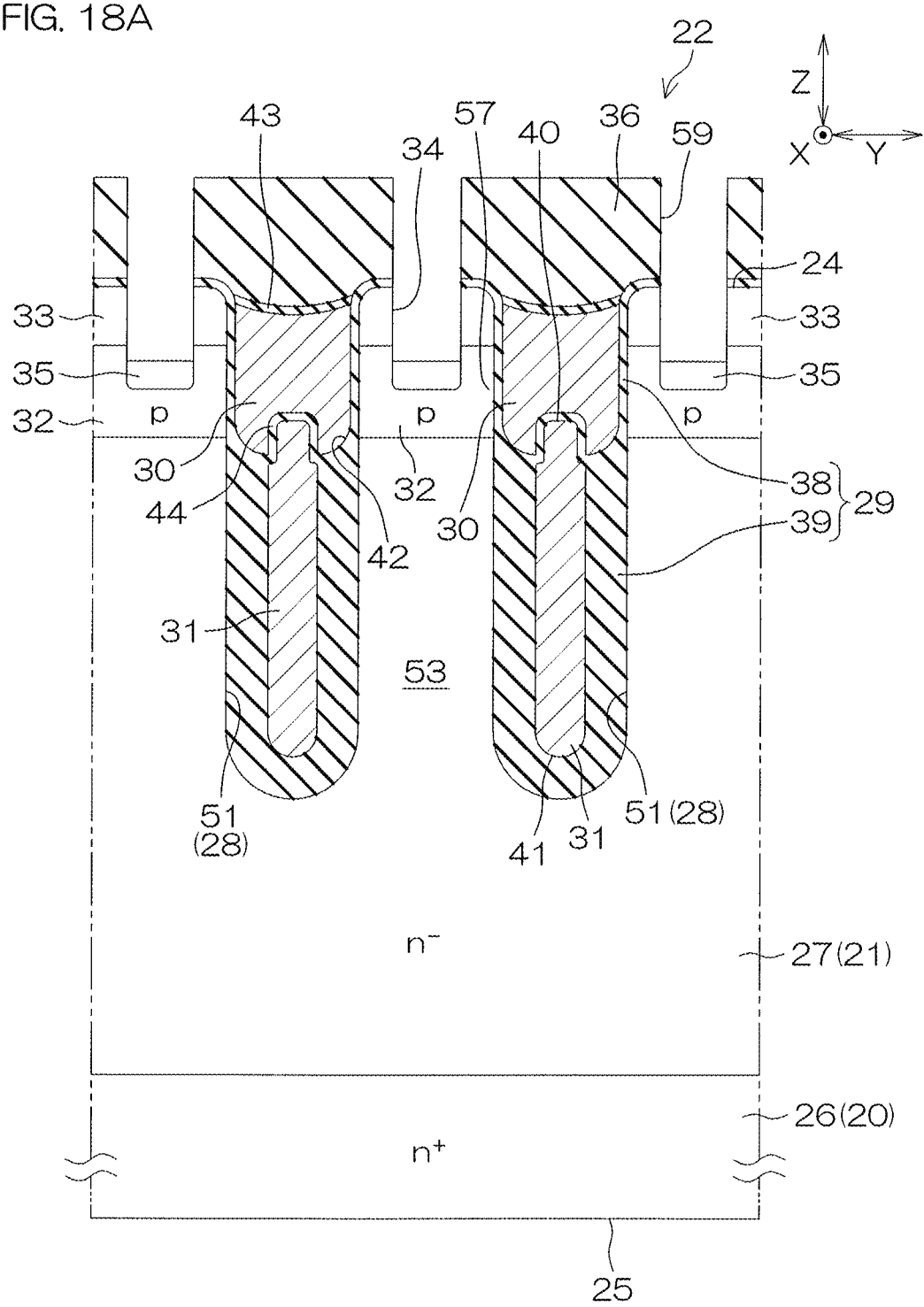
Figure 18B:
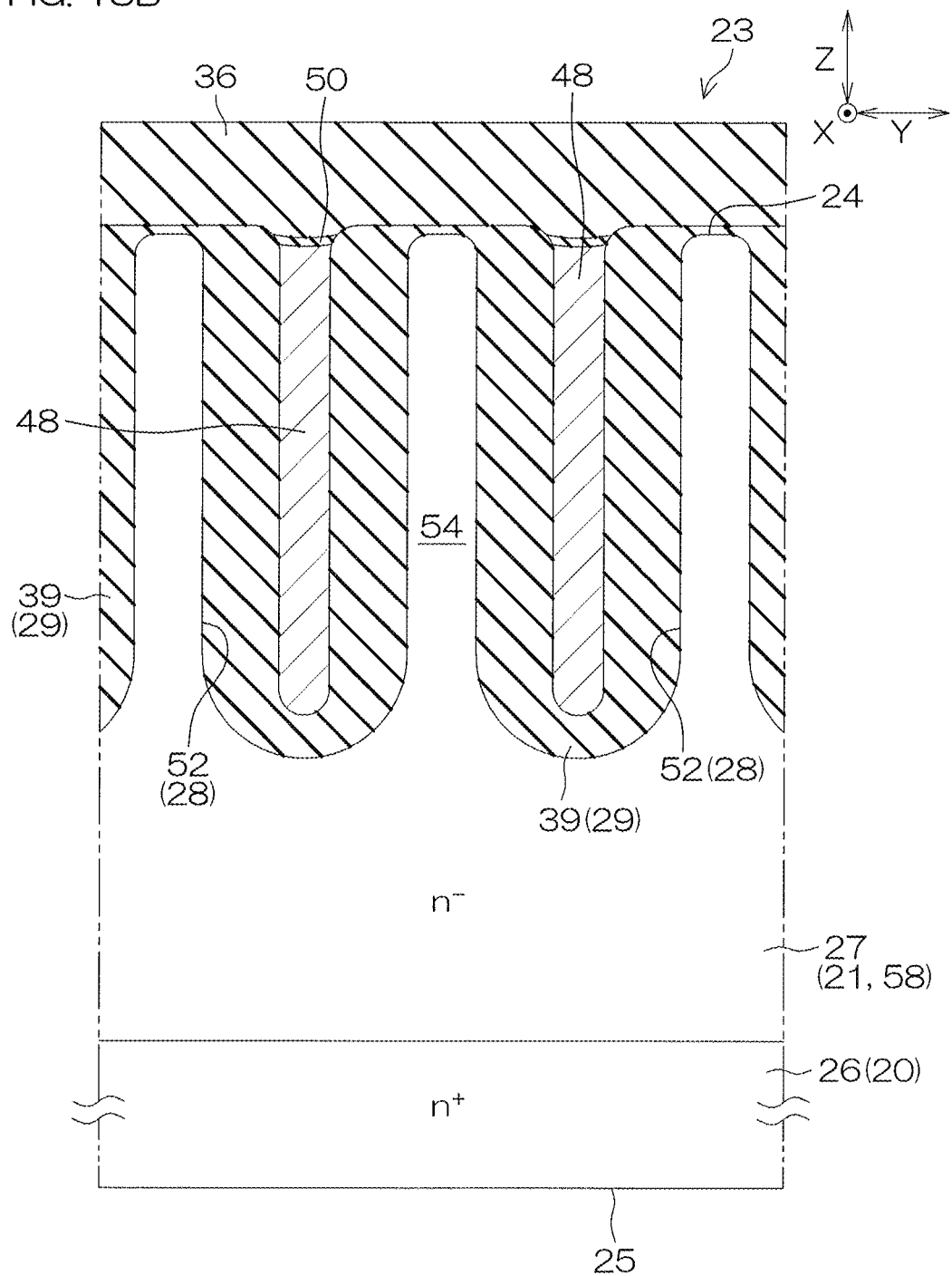

Thereafter, referring to FIGS. 18A and 18B, the first contact hole 59, the second contact hole 60, and the third contact hole 61 are formed in the interlayer insulating film 36. Thereafter, the contact trench 34 is formed by etching the epitaxial layer 21 through the first contact hole 59. Thereafter, the $p^+$ type channel contact region 35 is formed at the bottom surface of the contact trench 34. The $p^+$ type channel contact region 35 is formed by implanting p type impurities into the bottom surface of the contact trench 34 according to the ion implantation method through an ion implantation mask (not shown).

Figure 19A:
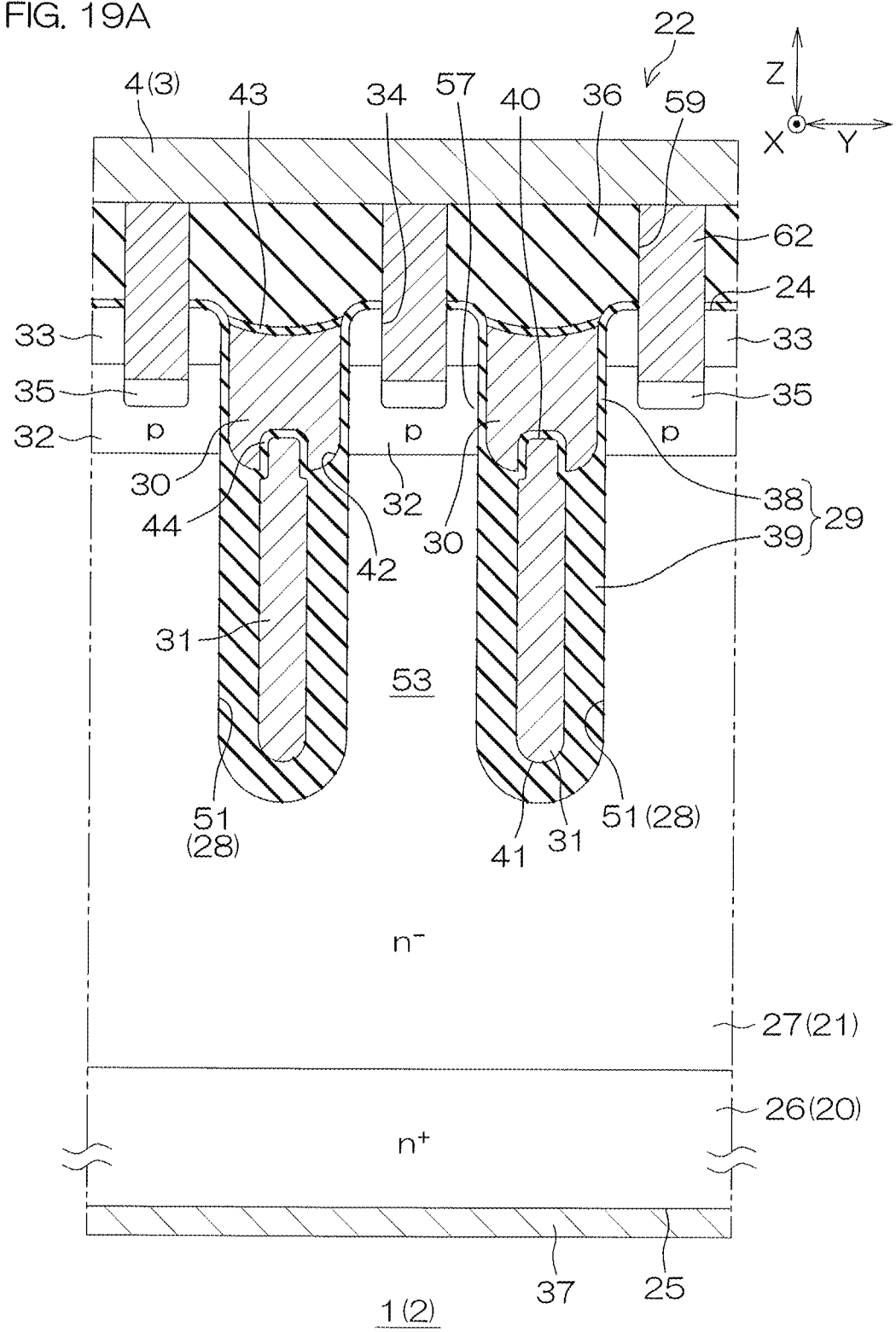
Figure 19B:
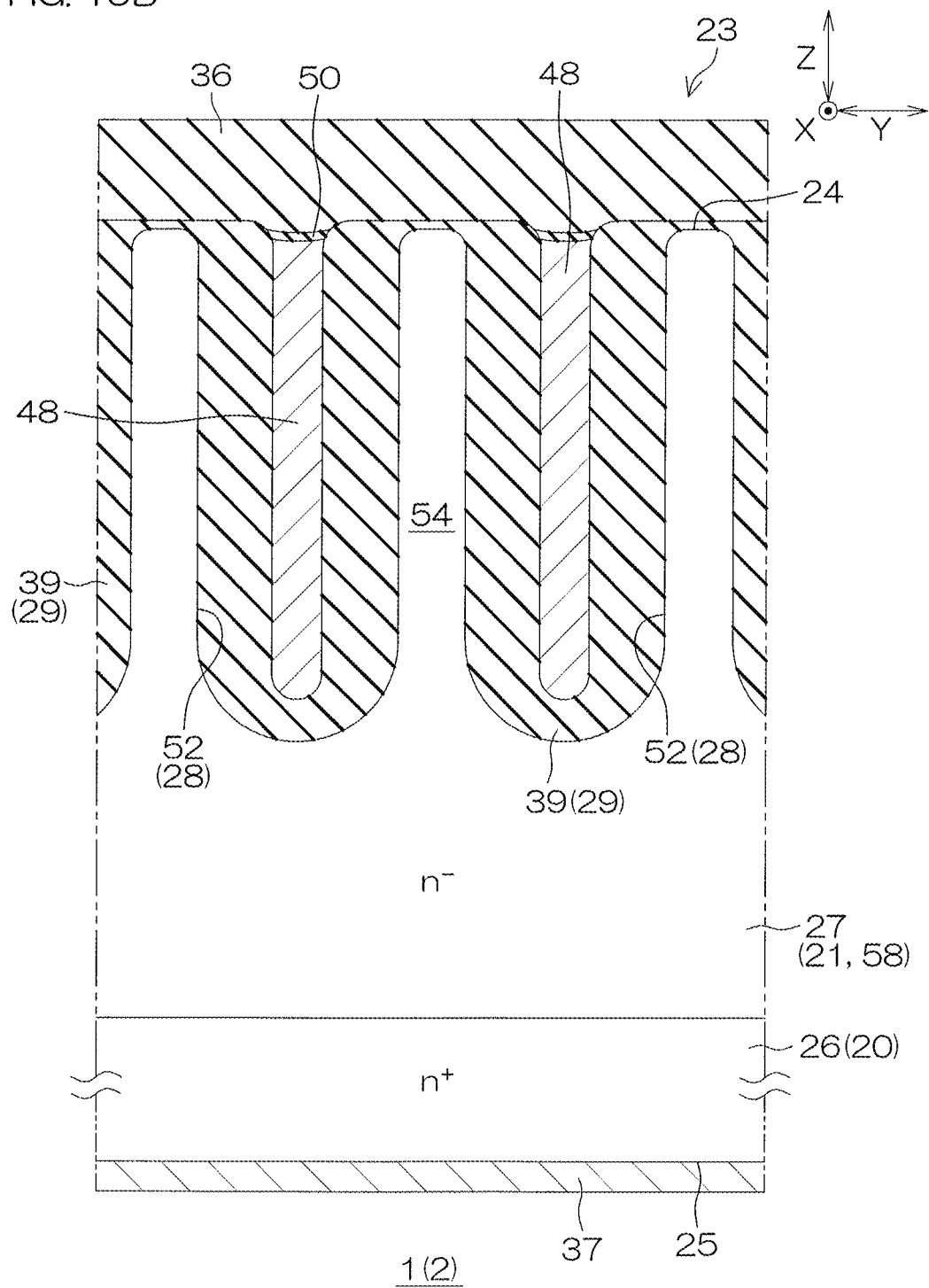

Thereafter, referring to FIGS. 19A and 19B, the first plug electrode 62, the second plug electrode 63, and the third plug electrode 64 are formed. More specifically, a conductive film (in the present preferred embodiment, tungsten) is formed such that the first contact hole 59, the second contact hole 60, and the third contact hole 61 are filled with the conductive film and such that a surface of the interlayer insulating film 36 is covered with the conductive film, and thereafter the conductor film is etched or is subjected to CMP, and, as a result, the first plug electrode 62, the second plug electrode 63, and the third plug electrode 64 are obtained. Thereafter, the source electrode film 4 and the first gate electrode film 5 are formed on the interlayer insulating film 36.

Thereafter, the drain electrode 37 is formed at the second surface 25 of the semiconductor substrate 20 (the $n^+$ type drain layer 26), and, as a result, the semiconductor device 1 can be obtained.

Next, effects of the semiconductor device 1 will be described. Prior to describing effects of the semiconductor device 1, a description will be given of structures and characteristics of semiconductor devices 68 to 70 according to reference examples.

Figure 20:
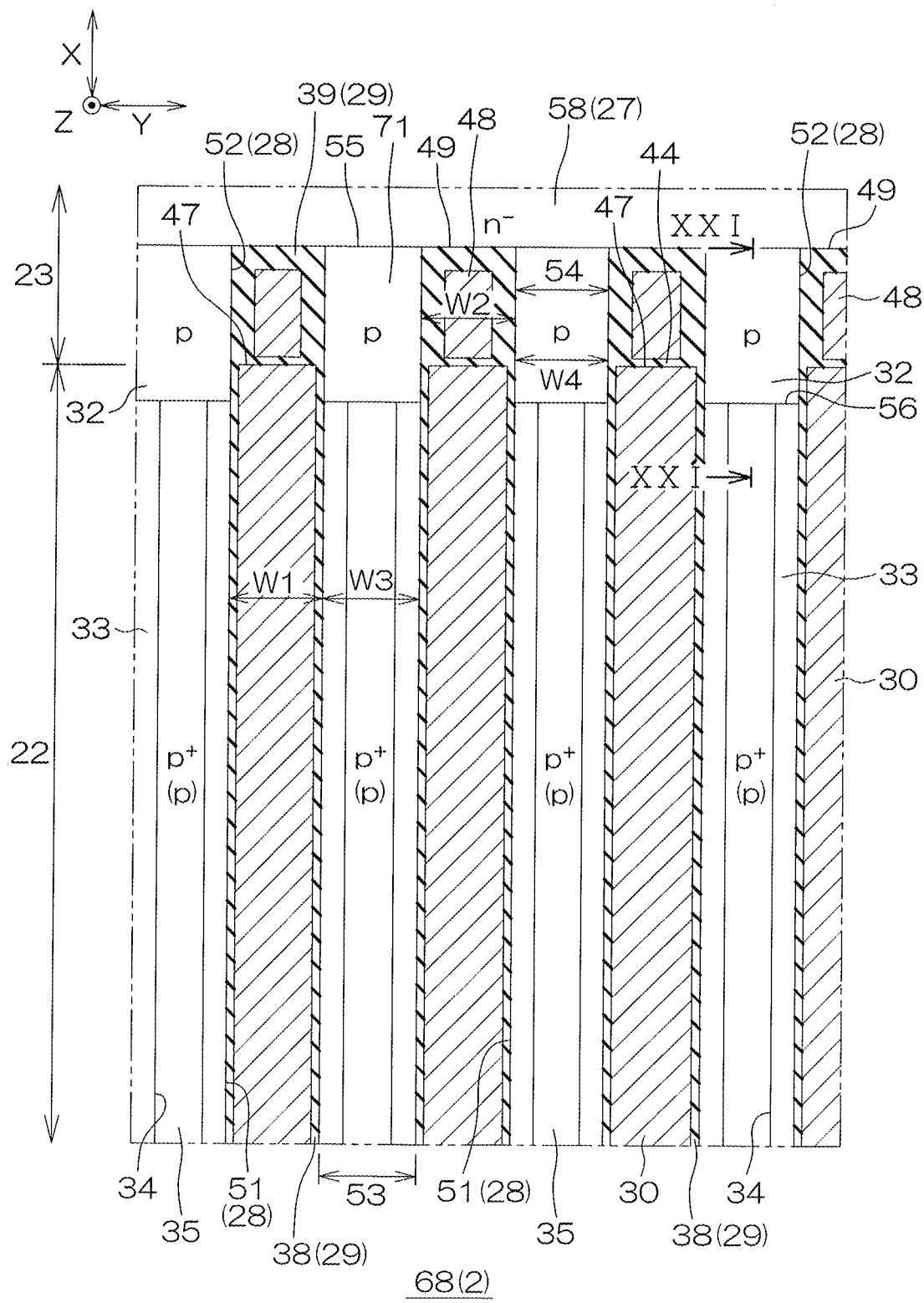
FIG. 20 is a see-through enlarged plan view showing a configuration of a part of the semiconductor device according to a first reference example.
Figure 21A:
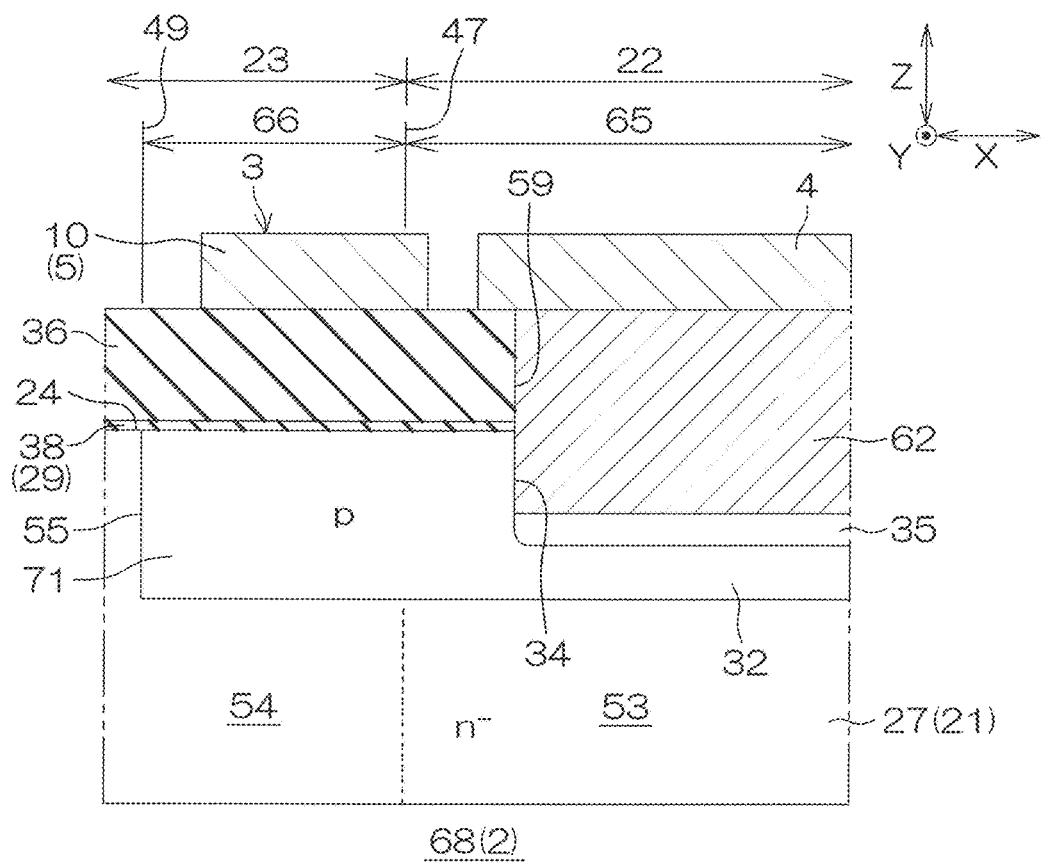
FIG. 21A is a cross-sectional view taken along line XXI-XXI in FIG. 20.
Figure 21B:
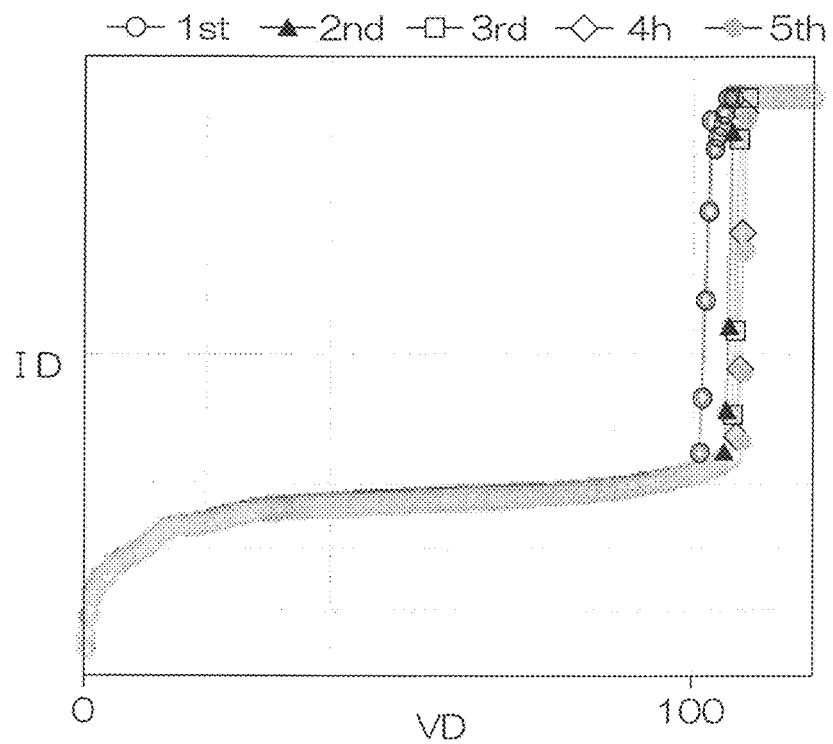
FIG. 21B is a diagram showing I-V characteristics of a structure of FIG. 21A.
Figure 22A:
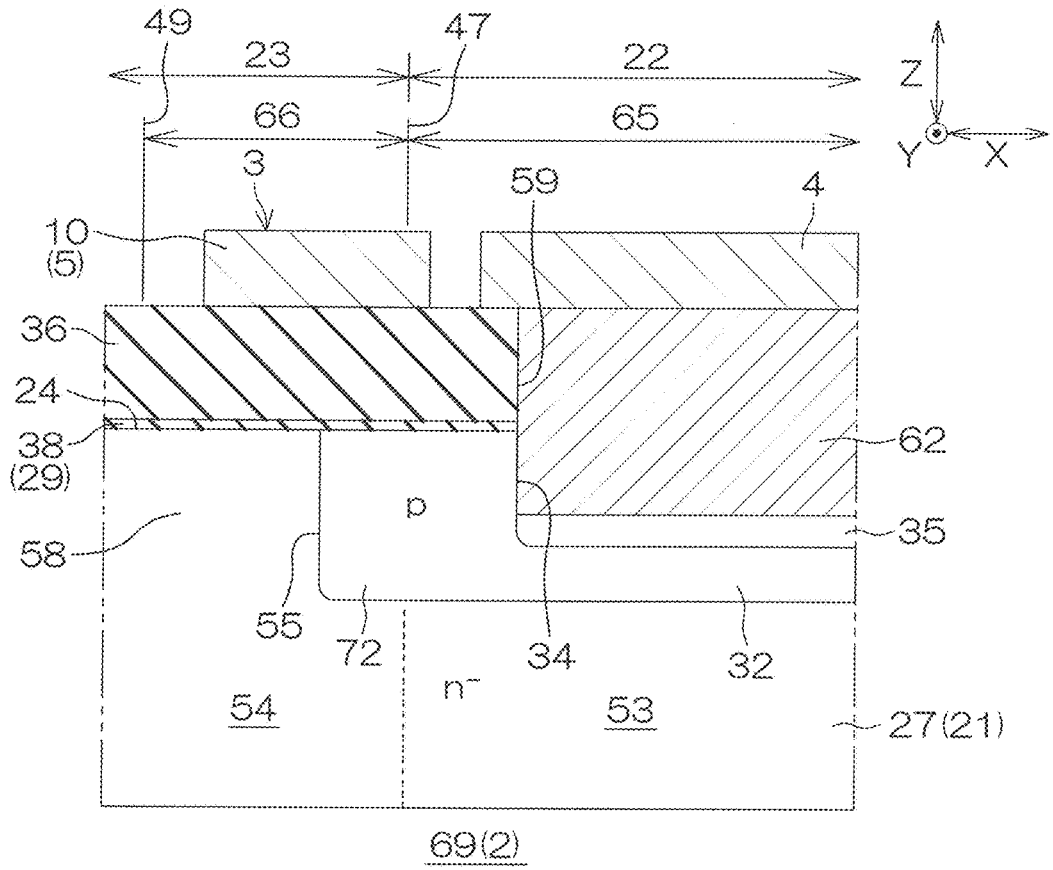
FIG. 22A is a schematic cross-sectional view showing a configuration of a part of the semiconductor device according to a second reference example.
Figure 22B:
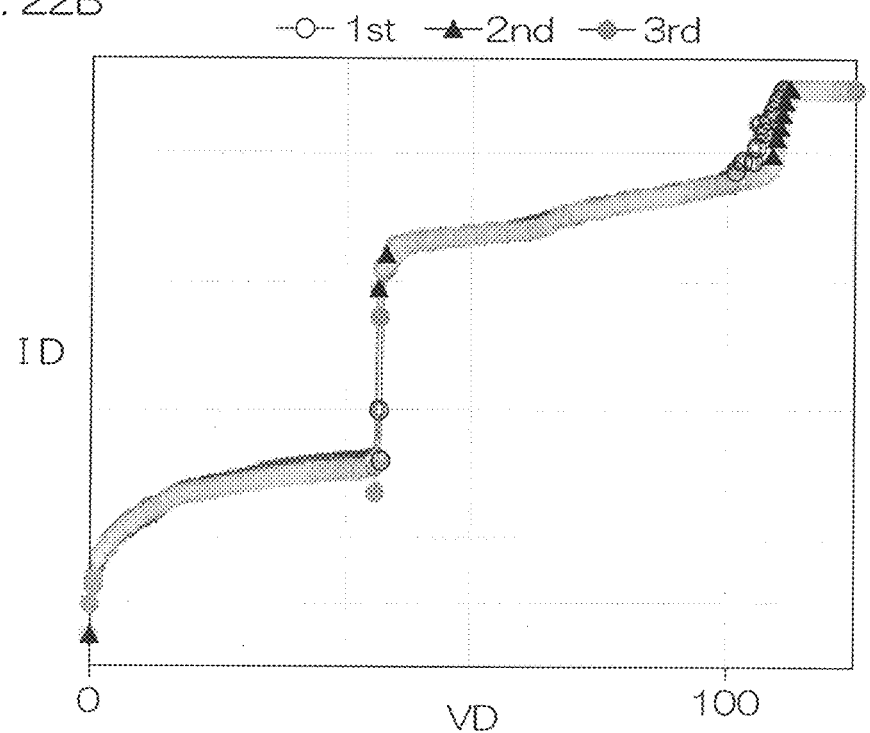
FIG. 22B is a diagram showing I-V characteristics of a structure of FIG. 22A.
Figure 23A:
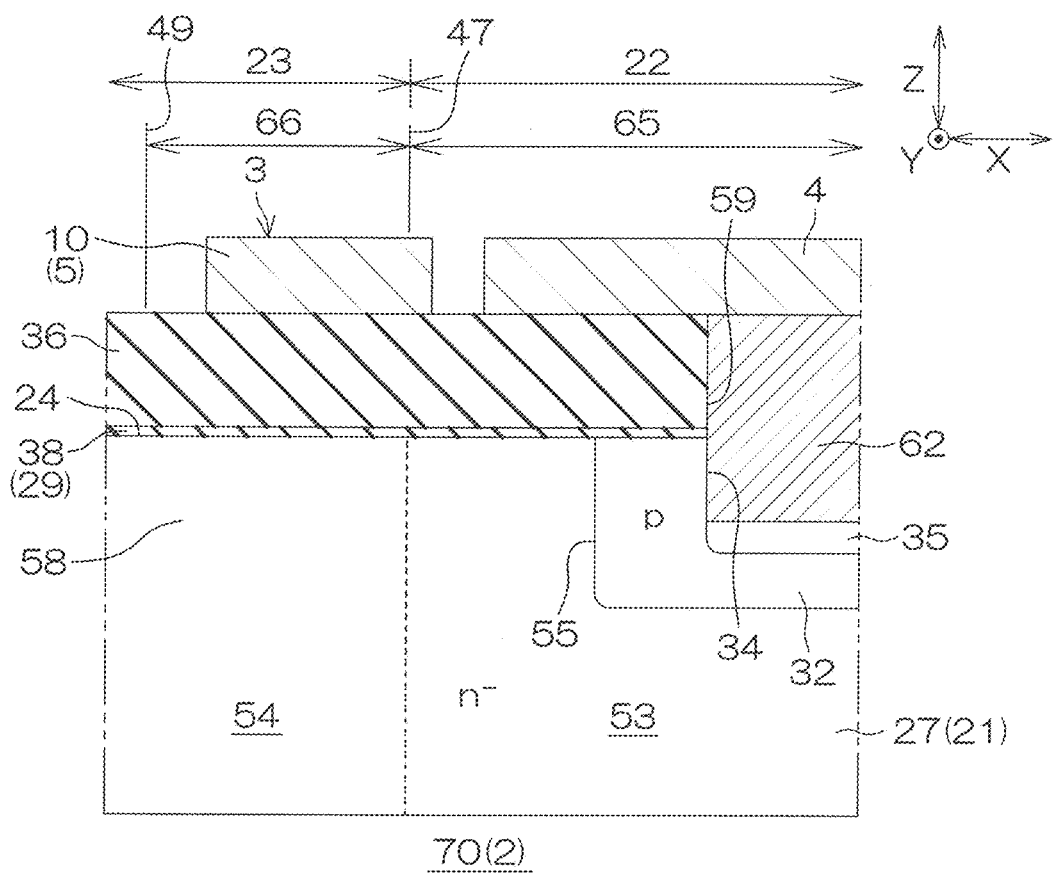
FIG. 23A is a schematic cross-sectional view showing a configuration of a part of the semiconductor device according to a third reference example.
Figure 23B:
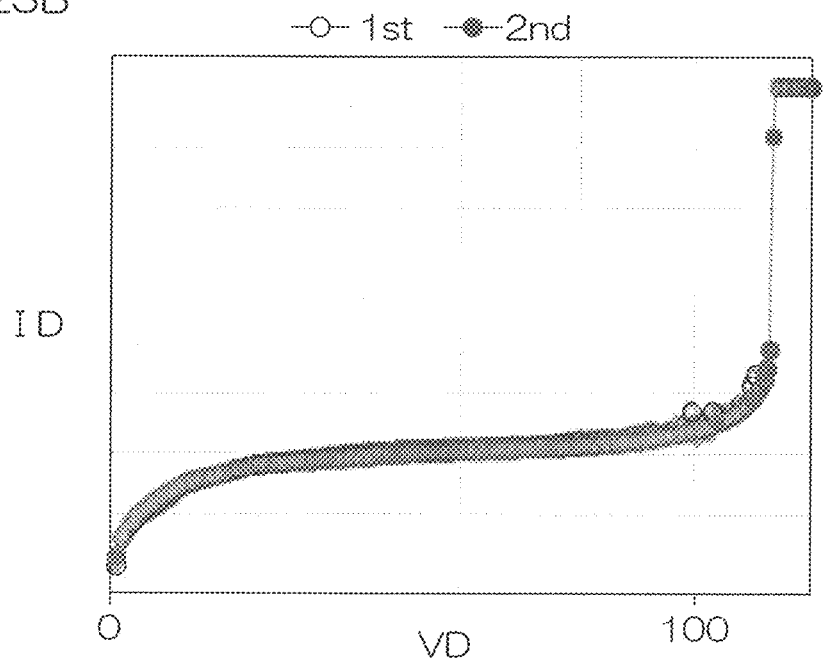
FIG. 23B is a diagram showing I-V characteristics of a structure of FIG. 23A.

FIG. 20 is a see-through enlarged plan view of a configuration of a part of a semiconductor device 68 according to a first reference example. FIG. 21A is a cross-sectional view taken along line XXI-XXI in. FIG. 20. FIG. 21B is a diagram showing I-V characteristics of a structure of FIG. 21A. FIG. 22A is a schematic cross-sectional view showing a configuration of a part of a semiconductor device 69 according to a second reference example. FIG. 22B is a diagram showing I-V characteristics of a structure of FIG. 22A. FIG. 23A is a schematic cross-sectional view showing a configuration of a part of a semiconductor device 70 according to a third reference example. FIG. 23B is a diagram showing I-V characteristics of a structure of FIG. 23A. In FIG. 21B, FIG. 22B, and FIG. 23B, the breakdown voltage of the first reference example is set and shown as 100.

The semiconductor device 68 of the first reference example differs from the aforementioned semiconductor device 1 in that (1) the width W1 of the first portion 51 and the width W2 of the second portion 52 of the gate trench 28 are equal to each other and in that (2) the p type channel region 32 has an extending portion 71 that extends further to a region adjacent to the second portion 52 of the gate trench 28 than to the termination 47 of the first gate electrode 30, and the termination 55 of the p type channel region 32 coincides with the termination 49 of the gate trench 28 as shown in FIG. 20 and FIG. 21A.

The semiconductor device 69 of the second reference example differs from the aforementioned semiconductor device 1 in that (1) the width W1 of the first portion 51 and the width W2 of the second portion 52 of the gate trench 28 are equal to each other (not shown) and in that (2) the p type channel region 32 has an extending portion 72 that extends further to a region adjacent to the second portion 52 of the gate trench 28 than to the termination 47 of the first gate electrode 30, and the termination 55 of the p type channel region 32 is positioned between the termination 49 of the gate trench 28 and the termination 47 of the first gate electrode 30 as shown in FIG. 22A.

The semiconductor device 70 of the third reference example differs from the aforementioned semiconductor device 1 in that (1) the width W1 of the first portion 51 and the width W2 of the second portion 52 of the gate trench 28 are equal to each other (not shown) and in that (2) the termination 55 of the p type channel region 32 is positioned on a more inward side than the termination 47 of the first gate electrode 30 as shown in FIG. 23A.

First, when comparison is made among characteristics of the semiconductor devices 68 to 70 according to the first to third reference examples, a higher breakdown voltage can be shown in the first reference example than in the second reference example, and this fact indicates a high withstand voltage, and yet a walk-out phenomenon occurs. In other words, a drain-to-source breakdown voltage $V_{DSS}$) characteristic is unstable at first measurement as shown in FIG. 21B.

On the other hand, a higher breakdown voltage can be shown in the third reference example than in the first and second reference examples, and a walk-out phenomenon is not ascertained. However, in the third reference example, the termination 55 of the p type channel region 32 is positioned on a more inward side than the termination 47 of the first gate electrode 30. Therefore, it is necessary to reduce the area of the basic structure of the MISFET 2 including the n⁻ type drift layer 27, the p type channel region 32, and the n⁺ type source region 33, and there is a possibility that desired on-resistance cannot be shown. Needless to say, the withstand Cage of the semiconductor device 69 according to the second reference example is lower than the semiconductor device 68 of the first reference example and lower than the semiconductor device 70 of the third reference example as shown in FIG. 22B.

Therefore, in the semiconductor device 1 according to the present preferred embodiment, the second width W2 of the gate trench 28 of the outer peripheral portion 23 is made larger than the first width W1 of the gate trench 28 of the element portion 22, and, as a result, it is possible to reduce the width W4 of the mesa portion 54 positioned between the gate trenches 28 of the outer peripheral portion 23.

Figure 24:
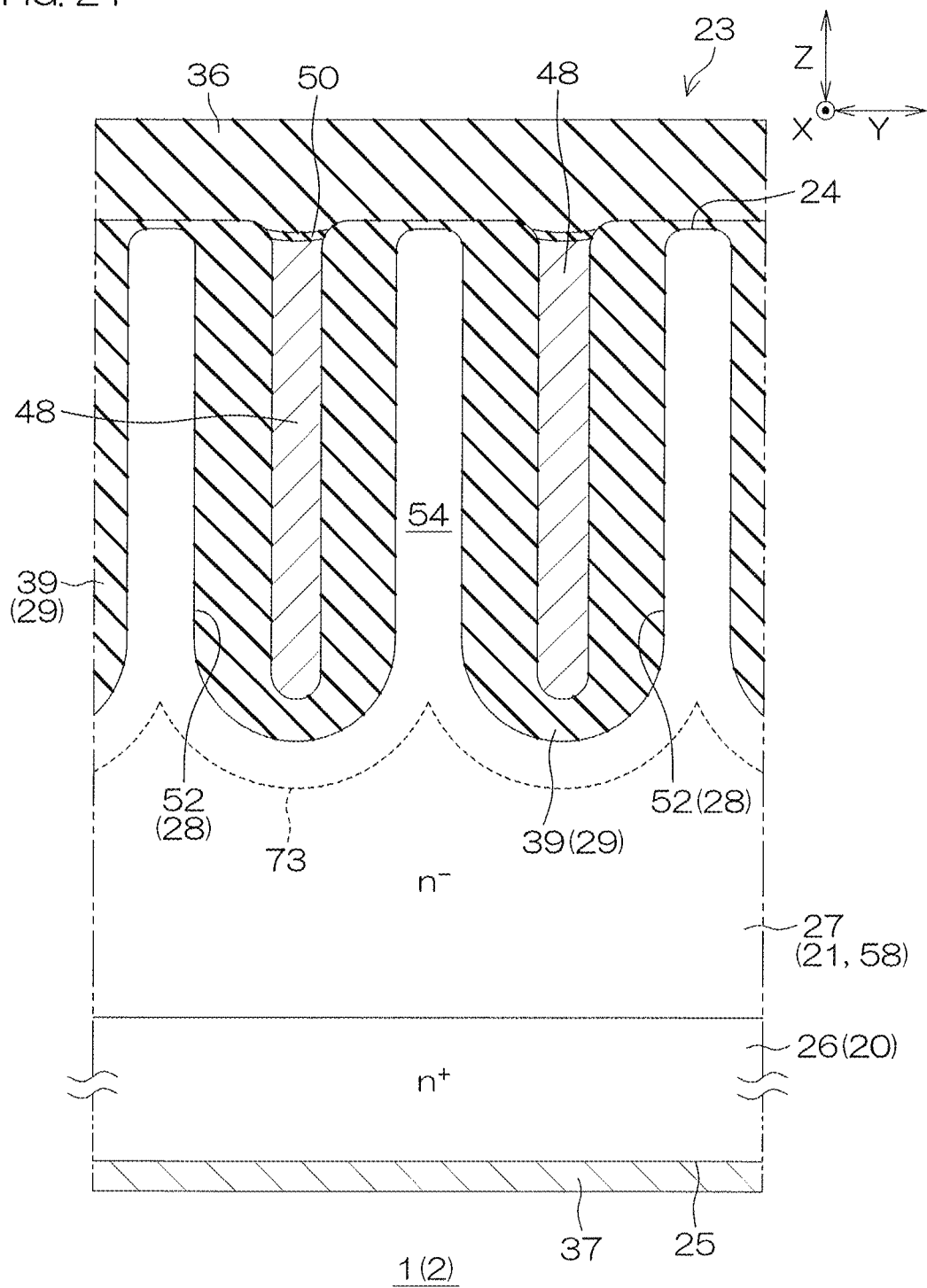
FIG. 24 is a view showing the spread of a depletion layer in an outer peripheral portion of the semiconductor device according to a preferred embodiment of the present invention.

This makes it possible to easily extend the depletion layer 73 toward the end of the outer peripheral portion 23 without allowing the depletion layer 73 to enter the inside of the mesa portion 54 as shown in FIG. 24. In other words, it is possible to suppress a decrease in withstand voltage in the outer peripheral portion 23 regardless of the position of the termination 55 of the p type channel region 32. As a result, the degree of freedom with respect to the position of the termination 55 of the p type channel region 32 becomes higher, and therefore it is possible to suppress a reduction in channel area in the element portion 22 and suppress a decrease in on-resistance by forming the p type channel region 32 within an appropriate range.

Although the preferred embodiment of the present invention has been described as above, the present invention can also be embodied in other modes.

Figure 25:
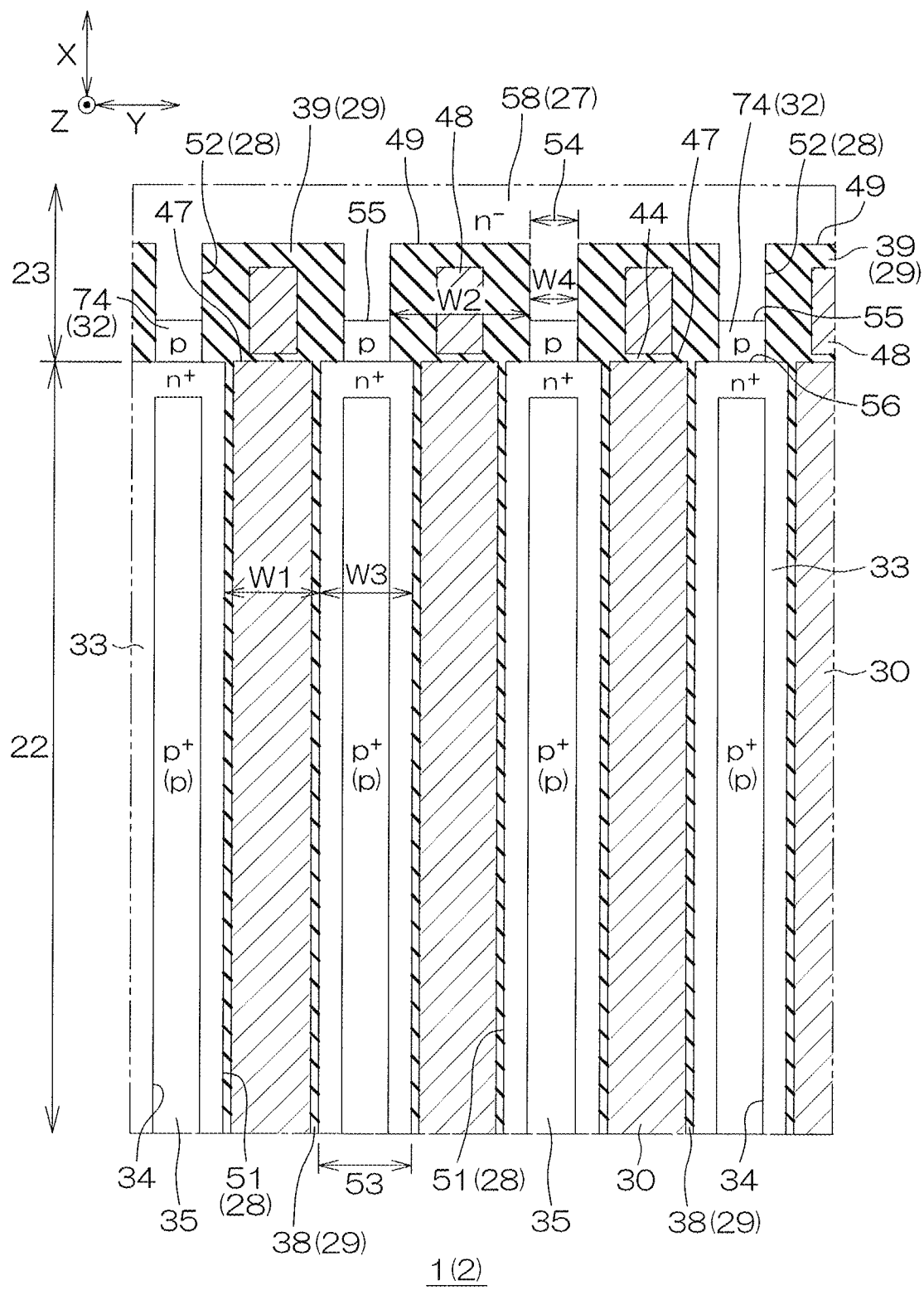
FIG. 25 is a view showing a first modification of the semiconductor device according to a preferred embodiment of the present invention.

For example, the p type channel region 32 may be also formed at the mesa portion 54 of the outer peripheral portion 23, and may have an extending portion 74 that extends further to a region adjacent to the second portion 52 of the gate trench 28 than to the termination 47 of the first gate electrode 30 as shown in FIG. 25. In other words, the termination 55 of the p type channel region 32 may be positioned on a more outward side than the termination 47 of the first gate electrode 30.

This makes it possible to prevent the termination 55 of the p type channel region 32 from being positioned on a more inward side than the termination 47 of the first gate electrode 30 even if a positional deviation from a design range somewhat occurs when the p type channel region 32 is formed (for example, when ion implantation is performed). As a result, it is possible to prevent the channel area from being reduced in the element portion 22. In this configuration, the termination 55 of the p type channel region 32 is positioned on a more outward side than the termination 47 of the first gate electrode 30 in the same way as in the aforementioned second reference example, and yet the width of the gate trench 28 in the outer peripheral portion 23 is the second width W2, and therefore it is possible to suppress a decrease in withstand voltage.

Figure 26:
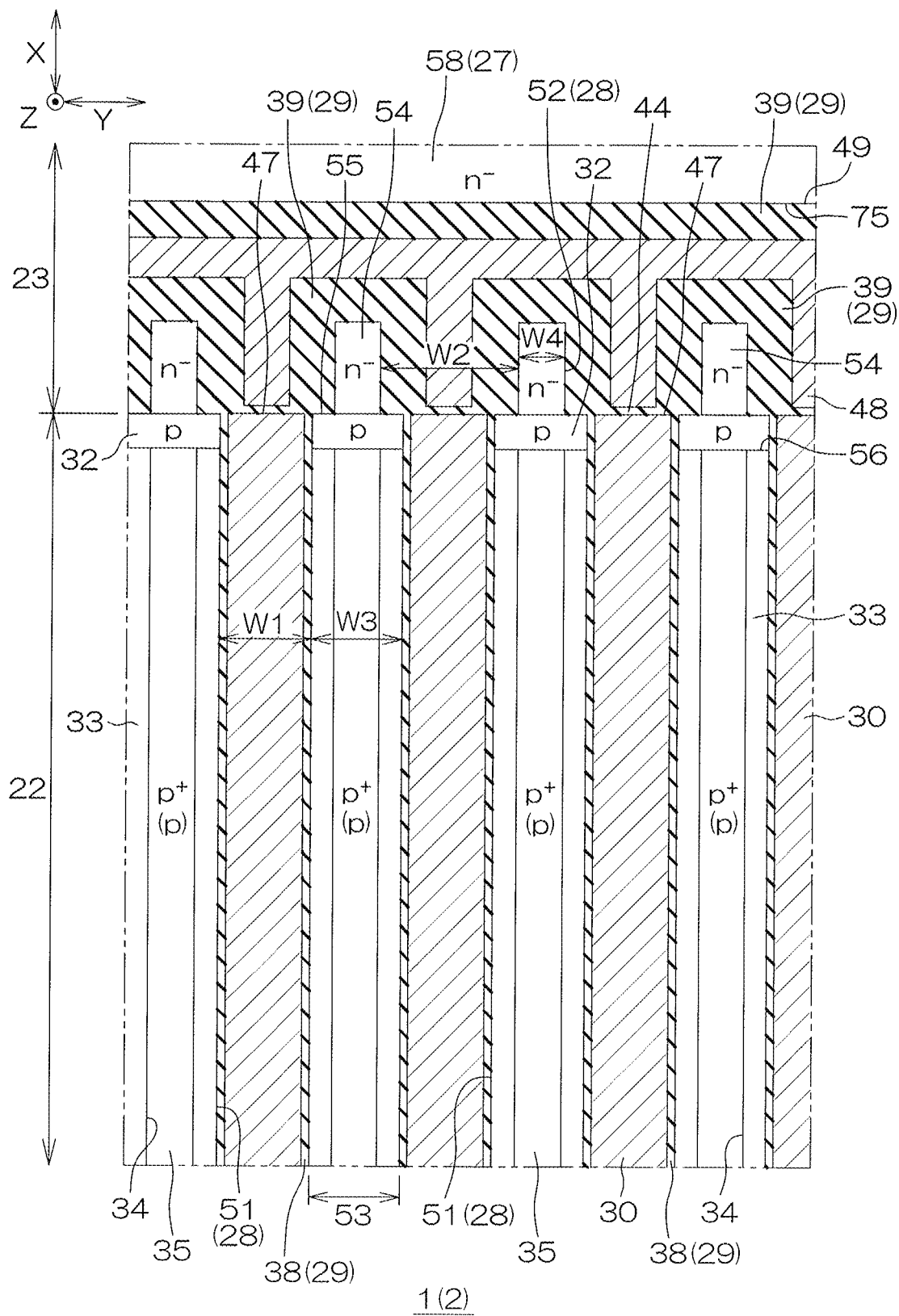
FIG. 26 is a view showing a first modification of the semiconductor device according to a preferred embodiment of the present invention.

Additionally, a second gate trench 75 by which the terminations 49 of the adjoining gate trenches 28 are connected together and that extends in a Y direction, which is an example of a second direction of the present invention, intersecting the X direction (in FIG. 26, perpendicularly intersecting) may further be formed as shown in FIG. 26. The second extension portion 48 of the second gate electrode 31 may be formed so as to be continuous with the second gate trench 75.

Figure 27:
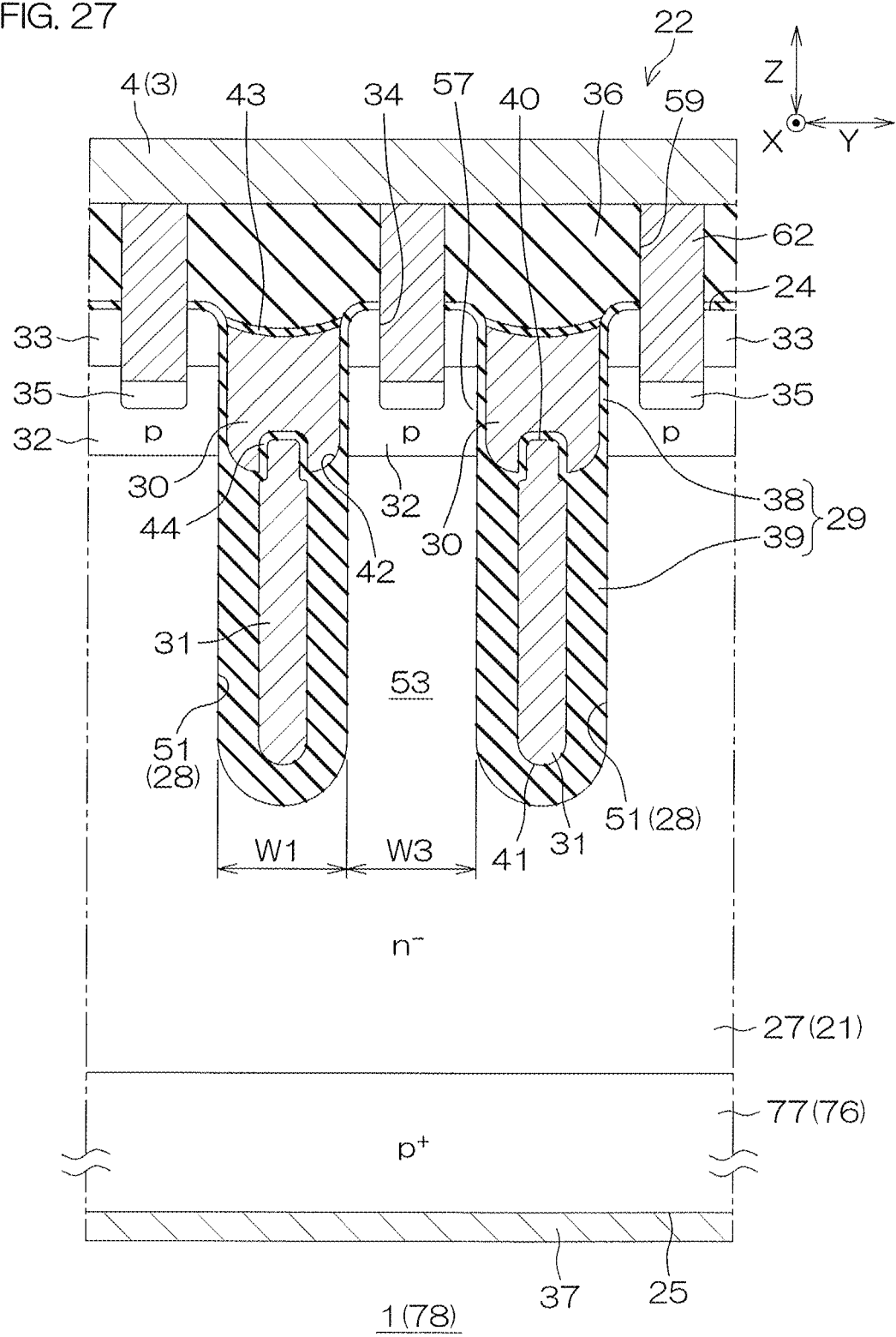
FIG. 27 is a view showing a first modification of the semiconductor device according to a preferred embodiment of the present invention.

Additionally, for example, the semiconductor device 1 may include an IGBT (Insulated Gate Bipolar Transistor) 78 by replacing the n⁺ type semiconductor substrate 20 with a p⁺ type semiconductor substrate 76 (p⁺ type collector layer 77) as shown in FIG. 27 although the MISFET has been taken as an example of the device structure of the semiconductor device 1 as described in the above preferred embodiment. At this time, the drain electrode 37 may be referred to as a collector electrode, and the source electrode film 4 may be referred to as an emitter electrode film. Additionally, the n⁺ type source region 33 may be referred to as an n⁺ type emitter region, and the p type channel region 32 may be referred to as a p type base region.

Additionally, the gate trench 28 may be lattice-shaped trench formed by, for example, combining trenches, which respectively extend in the X and Y directions, together. In this case, the p type channel regions 32 are arranged in a matrix manner.

Additionally, the MIS structure of the MISFET 2 and that of the IGBT 78 may be a trench gate structure as in the aforementioned preferred embodiments, or a planar gate structure.

Additionally, the structure of the gate electrode may be a structure according to an aspect in which the second gate electrode. 31 is omitted without being limited to the separation structure of the first and second gate electrodes 30 and 31 as mentioned above.

Additionally, a configuration in which the conductivity types of semiconductor parts of the semiconductor device 1 are reversed may be employed. For example, in the semiconductor device 1, the p type part may be n type, and the n type part may be p type.

Besides the above, various design changes may be applied within the scope of the matters described in the claims.

What is claimed is:

1. A semiconductor device comprising:
a semiconductor layer that has a first surface and a second surface;
a trench that is formed at the first surface of the semiconductor layer and that extends in a first direction;
an element portion that has a first-conductivity-type first region, a second-conductivity-type second region, and a first-conductivity-type third region that are formed in order along a depth direction of the trench from the first surface of the semiconductor layer;
a gate insulating film formed at an inner surface of the trench; and
a gate electrode that is embedded in the trench and that faces the first region, the second region, and the third region through the gate insulating film;
the trench including a first portion in which the gate electrode is embedded and that has a first width and a second portion that is formed only at an outer peripheral portion positioned on a more outward side than a termination of the gate electrode in the first direction and that has a second width larger than the first width, and the semiconductor device further comprising an embedded conductive layer embedded in the second portion of the trench and electrically separated from the gate electrode.

2. The semiconductor device according to claim 1, wherein the second region has a termination that coincides with the termination of the gate electrode in the first direction.

3. The semiconductor device according to claim 1, wherein the second region has an extending portion that extends further to a region adjacent to the second portion of the trench than to the termination of the gate electrode in the first direction.

4. The semiconductor device according to claim 1, wherein an extending portion of the third region is formed between the termination of the second region in the first direction and a termination of the trench.

5. The semiconductor device according to claim 1, wherein a distance from the termination of the trench in the first direction to the termination of the second region in the first direction is 3 μm to 15 μm.

6. The semiconductor device according to claim 1, wherein a width of a part of the semiconductor layer between second portions of adjoining trenches is 0.2 μm to 1.0 μm.

7. The semiconductor device according to claim 1, wherein a plurality of trenches is arranged as in a plurality of stripes, and trenches of the plurality of trenches are independent of each other.

8. The semiconductor device according to claim 1, wherein a plurality of trenches is arranged as stripes, the semiconductor device further comprising a second trench by which the terminations in the first direction of one trench of the plurality of trenches and the other trench of the plurality of trenches adjacent to the one trench are connected together and that extends in a second direction intersecting the first direction.

9. The semiconductor device according to claim 1, further comprising a second gate electrode embedded in a bottom-surface side of the trench with respect to the gate electrode, wherein an intermediate insulating film is formed between the gate electrode and the second gate electrode.

10. The semiconductor device according to claim 9, wherein the gate insulating film includes a first portion formed on the bottom-surface side of the trench and a second portion that is formed on an opening side of the trench and that is thinner than the first portion, and
the gate electrode is embedded in the trench across the first portion of the gate insulating film, and
the second gate electrode is embedded in the trench across the second portion of the gate insulating film.

11. The semiconductor device according to claim 1, wherein the element portion includes a MISFET that has the first region serving as a source region and the second region serving as a channel region.

12. The semiconductor device according to claim 1, wherein the element portion includes an IGBT that has the first region serving as an emitter region, the second region serving as a base region, and a second-conductivity-type collector region contiguous to the third region.

13. The semiconductor device according to claim 1, further comprising a gate finger formed on a circumferential edge of the semiconductor device and electrically connected to the gate electrode, wherein
the embedded conductive layer is formed directly under the gate finger in a plan view.

14. The semiconductor device according to claim 9, wherein the embedded conductive layer is formed integrally with the second gate electrode, passes a vicinity of the termination of the gate electrode in a thickness direction of the semiconductor layer, and extends to the first surface of the semiconductor layer.

15. The semiconductor device according to claim 1, wherein the embedded conductive layer has a width smaller than a width of the gate electrode in a plan view.

* * * * *